(12) United States Patent
Kim et al.

(10) Patent No.: US 9,197,247 B2
(45) Date of Patent: Nov. 24, 2015

(54) MEMORY SYSTEM AND ERROR CORRECTION METHOD

(71) Applicant: SAMSUNG ELECTRONICS CO., LTD., Suwon-si, Gyeonggi-do (KR)

(72) Inventors: Dong Kim, Seoul (KR); Seok-Won Ahn, Suwon-si (KR); JaePhil Kong, Seoul (KR); Myung-Suk Choi, Suwon-si (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 14/718,476

(22) Filed: May 21, 2015

(65) Prior Publication Data

US 2015/0256197 A1 Sep. 10, 2015

Related U.S. Application Data

(63) Continuation of application No. 14/242,264, filed on Apr. 1, 2014, now Pat. No. 9,063,857, which is a continuation of application No. 13/456,567, filed on Apr. 26, 2012, now Pat. No. 8,694,873.

(30) Foreign Application Priority Data

May 2, 2011 (KR) .......................... 10-2011-0041679

(51) Int. Cl.
*H03M 13/00* (2006.01)
*H03M 13/11* (2006.01)
(Continued)

(52) U.S. Cl.
CPC ....... *H03M 13/1105* (2013.01); *G06F 11/0793* (2013.01); *G06F 11/10* (2013.01); *G06F 11/1012* (2013.01); *H03M 13/2903* (2013.01); *H03M 13/2927* (2013.01); *H03M 13/3776* (2013.01); *H03M 13/611* (2013.01); *H03M 13/09* (2013.01); *H03M 13/152* (2013.01); *H03M 13/154* (2013.01); *H03M 13/1515* (2013.01); *H03M 13/1525* (2013.01); *H03M 13/1545* (2013.01); *H03M 13/19* (2013.01)

(58) Field of Classification Search
CPC ............ G06F 11/1012; G06F 11/0973; G06F 11/1044
USPC ......................................................... 714/785
See application file for complete search history.

(56) References Cited

U.S. PATENT DOCUMENTS 6,543,024 B2 4/2003 Gray
7,212,426 B2 5/2007 Park et al
(Continued)

FOREIGN PATENT DOCUMENTS

JP 2009-059422 3/2009
JP 2009-212623 9/2009
(Continued)

*Primary Examiner* — David Ton
(74) *Attorney, Agent, or Firm* — F. Chau & Associates, LLC

(57) ABSTRACT

Disclosed is an error correcting method which includes detecting an error of meta data having a seed used to randomize user data; correcting the error of the meta data when the error is detected from the meta data; receiving the user data based upon seed confirmation information associated with an error existence of the seed or an error correction result of the seed; detecting an error of the user data; and correcting the error of the user data when the error is detected from the user data.

20 Claims, 22 Drawing Sheets

(51) Int. Cl.
  G06F 11/10   (2006.01)
  H03M 13/29   (2006.01)
  H03M 13/37   (2006.01)
  G06F 11/07   (2006.01)
  *H03M 13/09*   (2006.01)
  *H03M 13/15*   (2006.01)
  *H03M 13/19*   (2006.01)

(56) References Cited

U.S. PATENT DOCUMENTS

| | | |
|---|---|---|
| 7,379,333 B2 | 5/2008 | Lee et al. |
| 7,398,351 B2 | 7/2008 | Jaquette et al. |
| 7,409,623 B2 | 8/2008 | Baker et al. |
| 7,433,141 B2 | 10/2008 | McAuliffe et al. |
| 7,672,170 B2 | 3/2010 | Lee et al. |
| 7,810,012 B1 * | 10/2010 | Boyer et al. .......... 714/758 |
| 7,945,825 B2 | 5/2011 | Cohen et al. |
| 8,004,898 B2 | 8/2011 | Park et al. |
| 8,339,854 B2 | 12/2012 | Yoon |
| 8,352,808 B2 | 1/2013 | Kim et al. |
| 8,700,950 B1 | 4/2014 | Syu |
| 8,782,500 B2 | 7/2014 | Weingerten |
| 2007/0211532 A1 | 9/2007 | Gonzalez et al. |
| 2007/0268905 A1 | 11/2007 | Baker et al. |
| 2008/0244362 A1 | 10/2008 | Liu et al. |
| 2009/0183052 A1 | 7/2009 | Kanno et al. |
| 2009/0217140 A1 | 8/2009 | Jo et al. |
| 2009/0259803 A1 | 10/2009 | Oh et al. |
| 2010/0082890 A1 | 4/2010 | Heo et al. |
| 2010/0217921 A1 | 8/2010 | Mun |
| 2010/0223530 A1 | 9/2010 | Son et al. |
| 2010/0229001 A1 | 9/2010 | Park et al. |
| 2010/0229007 A1 | 9/2010 | Park |
| 2010/0229032 A1 | 9/2010 | Lee |
| 2010/0241928 A1 | 9/2010 | Kim et al. |
| 2010/0269983 A1 | 10/2010 | Yoon |
| 2010/0306583 A1 | 12/2010 | Kim et al. |
| 2010/0315876 A1 | 12/2010 | Park et al. |
| 2011/0283166 A1 | 11/2011 | Kim et al. |
| 2012/0272017 A1 | 10/2012 | Lee et al. |
| 2013/0019051 A1 * | 1/2013 | Somanache et al. .......... 711/103 |

FOREIGN PATENT DOCUMENTS

| | | |
|---|---|---|
| KR | 1020090028507 | 3/2009 |
| KR | 1020090122219 | 11/2009 |
| KR | 20100113143 | 10/2010 |

* cited by examiner

MEMORY SYSTEM AND ERROR CORRECTION METHOD

CROSS-REFERENCE TO RELATED APPLICATIONS

This application is a continuation of U.S. application Ser. No. 14/242,264 filed on Apr. 1, 2014, which issued as U.S. Pat. No. 9,063,857 on Jun. 23, 2015, which is a continuation of U.S. application Ser. No. 13/456,567 filed on Apr. 26, 2012, which issued as U.S. Pat. No. 8,694,873 on Apr. 8, 2014, which claims priority under 35 U.S.C. §119 to Korean Patent Application No. 10-2011-0041679 filed on May 2, 2011, the disclosures of which are incorporated by reference herein in their entireties.

1. Technical Field

Exemplary embodiments relate to a memory system and an error correction method.

2. Description of the Related Art

A flash memory device is a non-volatile memory device, and a type of EEPROM capable of erasing a plurality of memory regions at the same time. A typical EEPROM may enable one memory region to be erased or programmed at the same time. Thus the flash memory device may operate faster and more effectively when systems accessing the flash memory device read and write to different memory regions. All types of EEPROM and the flash memory device may become worn out after the critical number of erase operations due to break down of an electrically insulating film in a memory transistor. The insulating film surrounds a charge storage node used to store data as electric charge. The flash memory device may also become worn out due to deterioration of the charge storage node.

The flash memory device formed a silicon chip may store information on non-volatilely (i.e., without a power needed to retain the stored information) and has a rapid read access time. This means that information is maintained without power consumption when a chip is not powered. The flash memory device may resist data loss in the event of physical impact. These characteristics may enable the flash memory device to be used as data storage devices (e.g., hard drives) in battery-powered devices.

SUMMARY

One aspect of embodiments of the inventive concept is directed to provide an error correcting method that comprises: detecting an error of meta data having a seed used to randomize user data; correcting the error of the meta data when the error is detected from the meta data; receiving the user data based upon seed confirmation information associated with an error existence of the seed or an error correction result of the seed; detecting an error of the user data; and correcting the error of the user data when the error is detected from the user data.

In this embodiment, the seed is located at a front portion of the meta data.

In this embodiment, the correcting the error of the meta data comprises calculating a syndrome of the meta data; finding an error location polynomial using the calculated syndrome; and performing Chien search on the error location polynomial.

In this embodiment, the calculating a syndrome of the meta data comprises generating the seed confirmation information when no error is detected from the meta data.

In this embodiment, the Chien search is made using backward Chien search.

In this embodiment, the Chien search is made using forward Chien search.

In this embodiment, the performing Chien search comprises generating the seed confirmation information when no error is detected from the seed; and when the error is detected from the seed, generating the seed confirmation information following error correction of the seed.

In this embodiment, the correcting an error of the user data comprises calculating a syndrome of the user data; finding an error location polynomial using the calculated syndrome; and performing Chien search on the error location polynomial.

Another aspect of embodiments of the inventive concept is directed to provide a memory system which comprises a randomizing circuit configured to generate a randomization seed and to randomize user data using the seed (and later, to de-randomize the randomized user data using the seed); an ECC circuit configured to encode meta data including the seed and the randomized user data (and later to decode the encoded meta data and the encoded user data); and at least one nonvolatile memory device configured to store the encoded meta data and the encoded user data, wherein the ECC circuit comprises a meta data decoder configured to decode the encoded meta data; and a user data decoder configured to decode the encoded user data based upon seed confirmation information associated with an error existence of the seed or an error correction result of the seed and generated in a decoding operation of the meta data decoder.

In this embodiment, the memory system further comprises a memory controller configured to control the at least one nonvolatile memory device, and wherein the memory controller includes the randomizing circuit and the ECC circuit.

In this embodiment, the meta data decoder comprises a first Syndrome Calculation Unit configured to calculate a syndrome of the encoded meta data and to generate seed confirmation information when no error is detected from the meta data; a first error location polynomial fining unit configured to find a first error location polynomial using the syndrome calculated by the first Syndrome Calculation Unit; a first Chien search unit configured to perform Chien search on the first error location polynomial for error detection and to generate the seed confirmation information when no error is detected from the seed; a first buffer unit configured to temporarily store the encoded meta data; and a first adder configured to add an output of the first buffer unit and an output of the first Chien search unit and to generate the seed confirmation information after an error of the seed is corrected.

In this embodiment, the user data decoder comprises a second Syndrome Calculation Unit configured to receive the encoded user data in response to the seed confirmation information and to calculate a syndrome of the encoded user data; a second error location polynomial fining unit configured to find a second error location polynomial using the syndrome calculated by the second Syndrome Calculation Unit; a second Chien search unit configured to perform Chien search on the second error location polynomial for error detection; a second buffer unit configured to receive the encoded user data based on the seed confirmation information and to temporarily store the encoded user data; and a second adder configured to add an output of the second buffer unit and an output of the second Chien search unit for error correction.

In this embodiment, the memory controller comprises at least one processing unit configured to control an overall operation of the memory controller; a buffer memory configured to temporarily store data generated during an operation of the memory controller; a host interface configured to exchange data between a host and the memory system; and a nonvolatile memory interface configured to exchange data between the at least one nonvolatile memory device and the memory controller.

In this embodiment, the number of bits processed by the user data decoder is more than that of the meta data decoder.

In this embodiment, the seed is used to randomize and de-randomized data corresponding to at least one sector.

The inventive concept is described more fully hereinafter with reference to the accompanying drawings, in which embodiments of the inventive concept are shown. This inventive concept may, however, be embodied in many different forms and should not be construed as limited to the embodiments set forth herein. Rather, these embodiments are provided so that this disclosure will be thorough and complete, and will fully convey the scope of the inventive concept to those skilled in the art. In the drawings, the size and relative sizes of layers and regions may be exaggerated for clarity. Like numbers refer to like elements throughout.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION OF EXEMPLARY EMBODIMENTS

Figure 1:
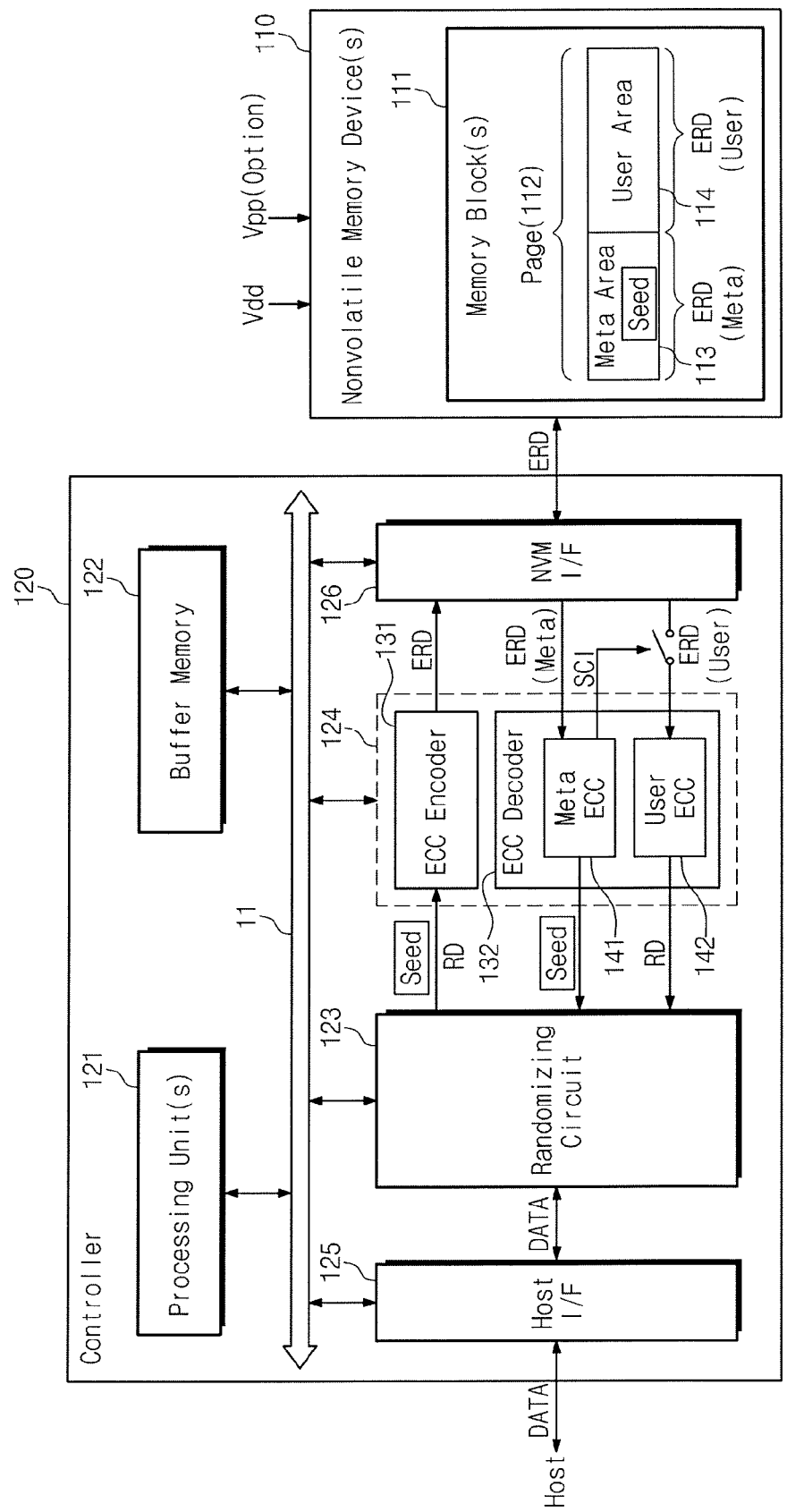
FIG. 1 is a block diagram of a memory system according to an exemplary embodiment of the inventive concept.

FIG. 1 is a block diagram of a memory system according to an exemplary embodiment of the inventive concept. Referring to FIG. 1, a memory system 10 includes at least one nonvolatile memory device 110 and a memory controller 120 controlling the nonvolatile memory device 110.

The nonvolatile memory device according to an exemplary embodiment of the inventive concept may be implemented as a NAND flash memory, a vertical NAND flash memory, a NOR flash memory, a resistive random access memory (RRAM), a phase-change RAM (PRAM), a magnetoresistive RAM (MRAM), a ferroelectric RAM (FRAM), a spin transfer torque RAM (STT-RAM), or the like. Further, the nonvolatile memory device according to an exemplary embodiment of the inventive concept can be implemented to have a three-dimensional array structure (see FIG. 3). The inventive concept may be applicable to a flash memory device, in which a charge storage layer is formed of a conductive floating gate, and a charge trap flash (CTF) memory in which a charge storage layer is formed of an insulation film. Below, for ease of description, the nonvolatile memory device in this exemplary embodiment is assumed to be a NAND flash memory device.

The nonvolatile memory device 110 may be configured to input and output encoded data ERD including an error correction code ECC handled by an ECC circuit 124. In an exemplary embodiment, at least one of a Hamming code, a BCH (Bose Chaudhuri Hocquenghem) code, an RS (Reed-Solomon) code, a CRC (Cyclic Redundancy Check) code, and the like may be used as the error correction code ECC. The nonvolatile memory device 110 may include at least one memory block 111. The memory block 111 may include a plurality of pages (not shown). The nonvolatile memory device 110 may perform a read operation and a write operation page by page (e.g., using selectively activated word lines).

For ease of description, one page 112 is exemplarily shown in FIG. 1. Each page 112 includes a meta area 113 and a user area 114.

The meta area 113 includes encoded meta data ERD (Meta). Herein, the encoded meta data ERD(Meta) may include meta data for managing the page 112 and a parity bit for the meta data. The parity for the meta data may be generated by the error correction code ECC Encoder circuit 131. In particular, the encoded meta data ERD(Meta) may include a "seed" used to randomize the page 112.

The user area 114 may include encoded user data ERD (User). Herein, the encoded user data ERD(User) may include user data and a parity bit for the user data. The user data may be data randomized using the seed. The parity for the user data may be generated by the error correction code ECC Encoder circuit 131.

As illustrated in FIG. 1, each page 112 may be divided into the meta area 113 and the user area 114. However, the inventive concept is not limited thereto. For example, the page can be divided into a main area and a spare area. Herein, the main area includes user data, and the spare area includes a parity bit for the user data, meta data, a parity bit for the meta data, and the like. An exemplary page configuration is disclosed in U.S. Patent Publication No. 2009/0180323, the entirety of which is incorporated by reference herein.

In FIG. 1, there is illustrated the exemplarily case that one encoded data ERD corresponds to one page 112. However, the inventive concept is not limited thereto. For example, each page 112 can be used to store a plurality of encoded data ERD. In an exemplary embodiment, the encoded data ERD may be formed by the sector.

The nonvolatile memory device 110 may be configured to be alternately supplied with a power supply voltage Vdd and a high voltage Vpp. Herein, the high voltage Vpp may be optional. The nonvolatile memory device 110 may be configured to use the high voltage Vpp according to a command from an external device (e.g., a host or a memory controller 120) or while the high voltage Vpp is detected. A nonvolatile memory device using the high voltage Vpp is disclosed in U.S. Pat. No. 7,672,170, the entirety of which is incorporated by reference herein.

The memory controller 120 may be configured to input and output data according to commands or requests from an external host. The memory controller 120 may be configured to control the nonvolatile memory device 110. For example, in response to a host request, the memory controller 120 may randomize input data to store it in the nonvolatile memory device 110 or may de-randomize data stored in the nonvolatile memory device to output it to the host. In an exemplary embodiment, the memory controller 120 controls the nonvolatile memory device 110 using executable firmware.

The memory controller 120 includes at least one processing unit 121, a buffer memory 122, a randomizing circuit 123, an ECC circuit 124, a host interface 125, and a nonvolatile memory interface 126. Herein, the elements 121 to 126 may be interconnected via a system bus 11.

The at least one processing unit 121 may be configured to control the overall operation of the memory system 10. In an exemplary embodiment, the at least one processing unit 121 includes two processing units performing different functions from each other.

The buffer memory 122 may be used to temporarily store data input from the host, data generated during an operation of the processing unit 121, data (e.g., firmware, boot code, etc.) for operating the memory controller 120, or management data (e.g., mapping table information) needed to manage the nonvolatile memory device 110. Herein, the boot code can be stored in a nonvolatile memory device (e.g., ROM, NOR flash memory, PRAM, etc.) included in the memory controller 120 although not shown in FIG. 1.

In an exemplary embodiment, the buffer memory 122 may be implemented as a volatile memory device (e.g., SRAM, DRAM, DDR memory, etc.). The buffer memory 122 may be included in the memory controller 120. However, the inventive concept is not limited thereto. For example, the buffer memory 122 can be provided external of the memory controller 120.

The randomizing circuit 123 is configured to randomize input data using a seed or to de-randomize randomized data using the seed. Herein, the seed may be generated from a seed generator (not shown) within or controlled by randomizing circuit 123. An exemplary randomizing circuit 123 is disclosed in U.S. Patent Publication Nos. 2009/0259803, 2010/0217921, 2010/0223530, and 2010/0315876, the entirety of which are incorporated by reference herein. As disclosed in these publications, a memory controller comprises a random pattern generator that is operable to generate and select a random pattern corresponding to a seed value. The user data to be stored is logically combined (e.g. XOR-ed) with the selected random pattern corresponding to the seed value, and is thereby changed before it is stored in the memory cells. To recover the user data after it has been changed and stored in this manner, it is necessary to store and recover the seed corresponding to the changed user data. Preferably, the changed user data and its corresponding seed are stored in the same page in the flash memory. The seed may be stored in the main area or in the spare (meta) area of that page in the flash memory.

While encoding, the ECC encoder circuit 131 portion of the ECC circuit 124 may be configured to output encoded (randomized) data ERD corresponding to randomized data RD and a seed from the randomizing circuit 123. While decoding, the ECC decoder circuit 132 portion of the ECC circuit 124 may be configured to output randomized data RD and a seed by detecting or correcting an error of encoded (randomized) data ERD received from the NVM device(s) 110. Herein, the decoding may include the first decoding operation of encoded (randomized) meta data ERD(Meta) and the second decoding operation of encoded (randomized) user data ERD(User). The second decoding operation may be made according to information (hereinafter, referred to as seed confirmation information SCI) associated with an error existence of the seed or error correction result of the seed in the first decoding operation.

The ECC circuit 124 includes an ECC encoder 131 and an ECC decoder 132.

The ECC encoder 131 ECC-encodes randomized data RD and a seed to generate parities (i.e., parity bits) each corresponding to the randomized data RD and the seed. At this time, the randomized data RD, the seed, and the parities may constitute encoded data ERD. Although not shown in FIG. 1, the ECC encoder 131 may generate a parity bit by encoding meta data (other than the seed) corresponding to data from the processing unit 121.

In an exemplary embodiment, the ECC encoder 131 generates a parity bit using a BCH (Bose Chaudhuri Hocquenghem) error correction algorithm.

In another embodiment, the ECC encoder 131 generates a parity bit using an RS (Reed Solomon) error correction algorithm.

The ECC decoder 132 includes meta data decoder 141 and a user data decoder 142.

The meta data decoder 141 performs the first ECC-decoding operation. Thus, the meta data decoder 141 performs error-detection and error-correction on the encoded meta data ERD(Meta). At the first decoding operation, first of all, the meta data decoder 141 judges error detection or correction on a seed in the encoded meta data ERD(Meta) and generates seed confirmation information SCI according to the judgment result.

The user data decoder 142 performs the second ECC-decoding operation. Thus, the user data decoder 142 makes error detection or correction based on the decoded user data ERD(User) in response to the seed confirmation information SCI.

In an exemplary embodiment, the number of bits processed by the user data decoder 142 may be more than that processed by the meta data decoder 141.

Examples of the ECC circuit 124 are disclosed in U.S. Patent Publication Nos. 2009/0217140, 2009/0259803, 2010/0217921, 2010/0223530, 2010/0229032, and 2010/0241928, the entirety of which are incorporated by reference herein.

The host interface 125 provides an interface between a host and the memory system 10 to exchange data. In an exemplary embodiment, the host interface 125 may be implemented to communicate with host via one of many known or future interface protocols such as an USB (Universal Serial Bus) protocol, an MMC (multimedia card) protocol, a PCI (peripheral component interconnection) protocol, a PCI-E (PCI-express) protocol, an ATA (Advanced Technology Attachment) protocol, a serial ATA protocol, a parallel ATA protocol, a SCSI (small computer small interface) protocol, an ESDI (enhanced small disk interface) protocol, an IDE (Integrated Drive Electronics) protocol, a PPN (Perfect Page New) protocol, an UFS (Universal Flash Storage) protocol, and the like.

The nonvolatile memory interface 126 may provide an interface between the nonvolatile memory device 110 and the memory controller 120 to exchange encoded data ERD. In an exemplary embodiment, the nonvolatile memory interface 126 may be implemented to communicate with the nonvolatile memory device 110 in synchronization with a clock signal.

As illustrated in FIG. 1, the ECC circuit 124 may be included outside the nonvolatile memory interface 126. However, the inventive concept is not limited thereto. For example, the ECC circuit 124 can be provided as one element of the nonvolatile memory interface 126.

During an data output operation, a conventional memory system may perform the second decoding operation following the first decoding operation. On the other hand, the memory system 10 according to an exemplary embodiment of the inventive concept may generate seed confirmation information SCI by judging error detection or correction on a seed at the first decoding operation and may perform the second decoding operation in response to the seed confirmation information SCI. With the above description, the memory system 10 according to an exemplary embodiment of the inventive concept may reduce the wait time of encoded user data ERD(User) as compared with the typical memory system.

The nonvolatile memory device 110 and the memory controller 120 may be integrated in a single chip and formed on a substrate.

The memory system 10 may further include constituent elements and additional functions/operations which are in more detail disclosed in U.S. Patent Publication No. 2010/0082890, the entirety of which is incorporated by reference herein.

Figure 2:
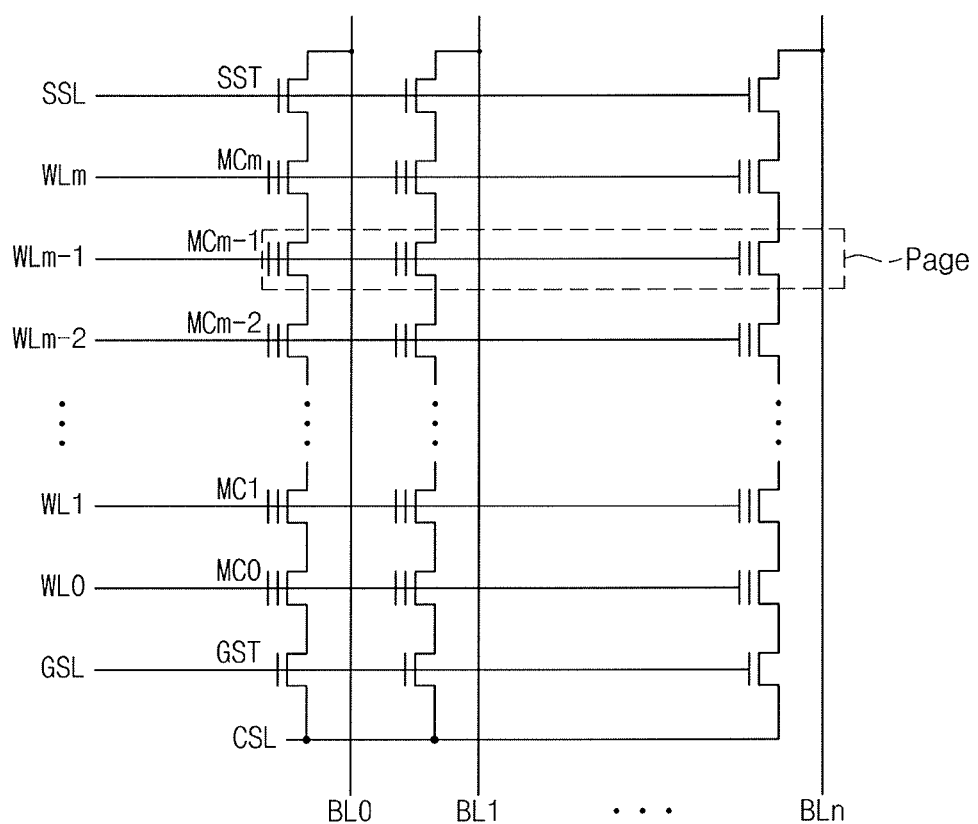
FIG. 2 is a diagram of a memory block in FIG. 1 according to an exemplary embodiment of the inventive concept.

FIG. 2 is a diagram of a memory block in FIG. 1 according to an exemplary embodiment of the inventive concept. Referring to FIG. 2, a memory block 111 includes a plurality of memory cell strings arranged in a NAND configuration. Each of the NAND strings includes a string selection transistor SST connected with a string selection line SSL, a plurality of memory cells MC0 to MCm each connected with a plurality of word lines WL0 to WLm (m being an integer), and a ground selection transistor GST connected with a ground selection line GSL.

In each cell string, the string selection transistor SST is connected with a corresponding bit line BL, and the ground selection transistor GST is connected with a common source line CSL. The common source line CSL is supplied with a ground voltage or a CSL voltage (e.g., a power supply voltage) from a CSL driver (not shown).

Each of the memory cells MC0 to MCm may store one or more bits of data. The plurality of n memory cells connected with one word line may constitute one page, which is formed of at least one logical page.

A memory block is disclosed in more detail in U.S. Pat. No. 7,379,333, the entirety of which is incorporated by reference herein.

Figure 3:
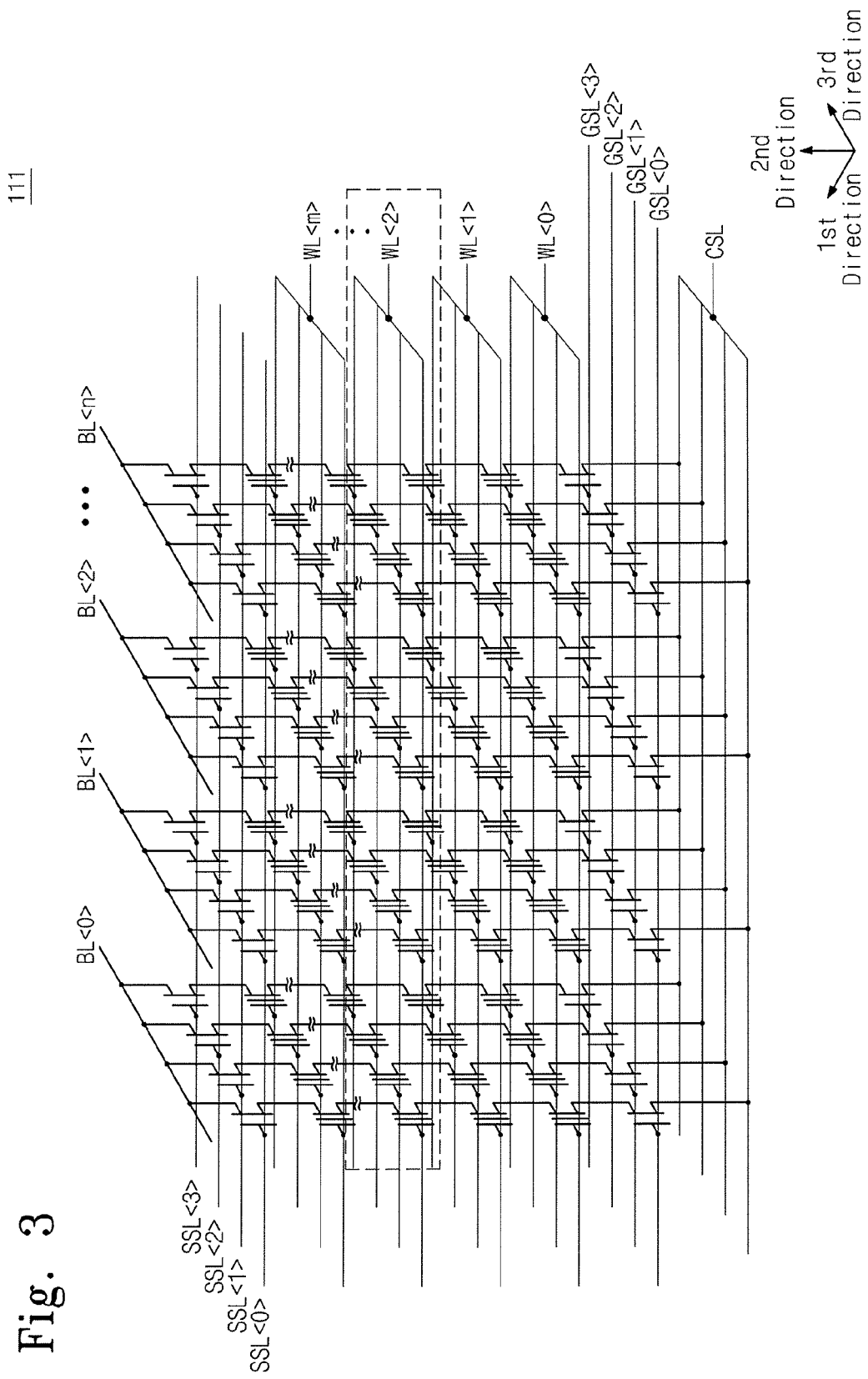
FIG. 3 is a circuit diagram of a memory block in FIG. 1 according to another exemplary embodiment of the inventive concept.

FIG. 3 is a circuit diagram of a memory block in FIG. 1 according to another exemplary embodiment of the inventive concept. Referring to FIG. 3, a memory block 111 includes a plurality of vertical NAND strings. Each of the vertical NAND strings may extend in the second direction (a vertical direction perpendicular to the plane of a substrate). The vertical strings may be connected between bit lines BL<0> to BL<n> and a common source line CSL. The bit lines BL<0> to BL<n> extend in the third direction (e.g. a horizontal direction parallel to the plane of the substrate and perpendicular to the second direction). In FIG. 3, there is shown the exemplary case that each one bit line is connected with four vertical strings (e.g., through a plurality of string selection transistors that operate together as a demultiplexer).

Four vertical strings in a column may be connected with a corresponding bit line (e.g., BL<0>) via four string selection transistors controlled by string selection lines SSL<0>, SSL<1>, SSL<2>, and SSL<3>, respectively. Herein, the string selection lines SSL<0>, SSL<1>, SSL<2>, and SSL<3> extend in the first direction (e.g. a horizontal direction parallel to the plane of the substrate and perpendicular to the second and third directions). For ease of description, four string selection lines SSL<0>, SSL<1>, SSL<2>, and SSL<3> are exemplarily illustrated in FIG. 3. However, the inventive concept is not limited thereto.

Four vertical strings in a column may be connected with a common source line CSL via four ground select transistors controlled by ground selection lines GSL<0>, GSL<1>, GSL<2>, and GSL<3>, respectively. Herein, the ground selection lines GSL<0>, GSL<1>, GSL<2>, and GSL<3> may extend in the first direction. For ease of description, four ground selection lines GSL<0>, GSL<1>, GSL<2>, and GSL<3> are exemplarily illustrated in FIG. 3. However, the inventive concept is not limited thereto.

Each of the vertical NAND strings includes a plurality of series-connected memory cells (memory transistors), each of which is connected with a corresponding word line WL<0> to WL<m>. Each memory cell may store 1-bit data or multi-bit data. The plurality of memory cells connected with one word line (e.g., WL2) constitute one page. Herein, the page may be used to store at least one logical page.

A memory block in FIG. 3 is described in more detail in U.S. Patent Publication No. 2010/0315875, the entirety of which is incorporated by reference herein.

Figure 4:
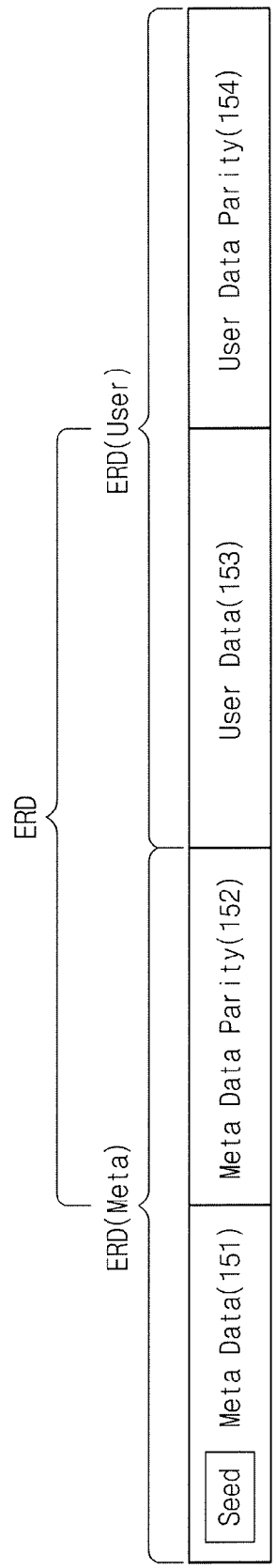
FIG. 4 is a diagram illustrating a configuration of encoded data according to an exemplary embodiment of the inventive concept.

FIG. 4 is a diagram of a configuration of encoded data according to an exemplary embodiment of the inventive concept. Referring to FIG. 4, encoded data ERD may include encoded meta data ERD(Meta) and encoded user data ERD(User).

The encoded meta data ERD(Meta) may include meta data 151 and a meta data parity (bit) 152. The meta data 151 may include a seed.

In an exemplary embodiment, the seed may be 2 bytes, the meta data 151 may be 16 bytes, and the meta data parity bit 152 may be 28 bytes.

The encoded user data ERD(User) may include user data 153 and user data parity bits 154.

Figure 5:
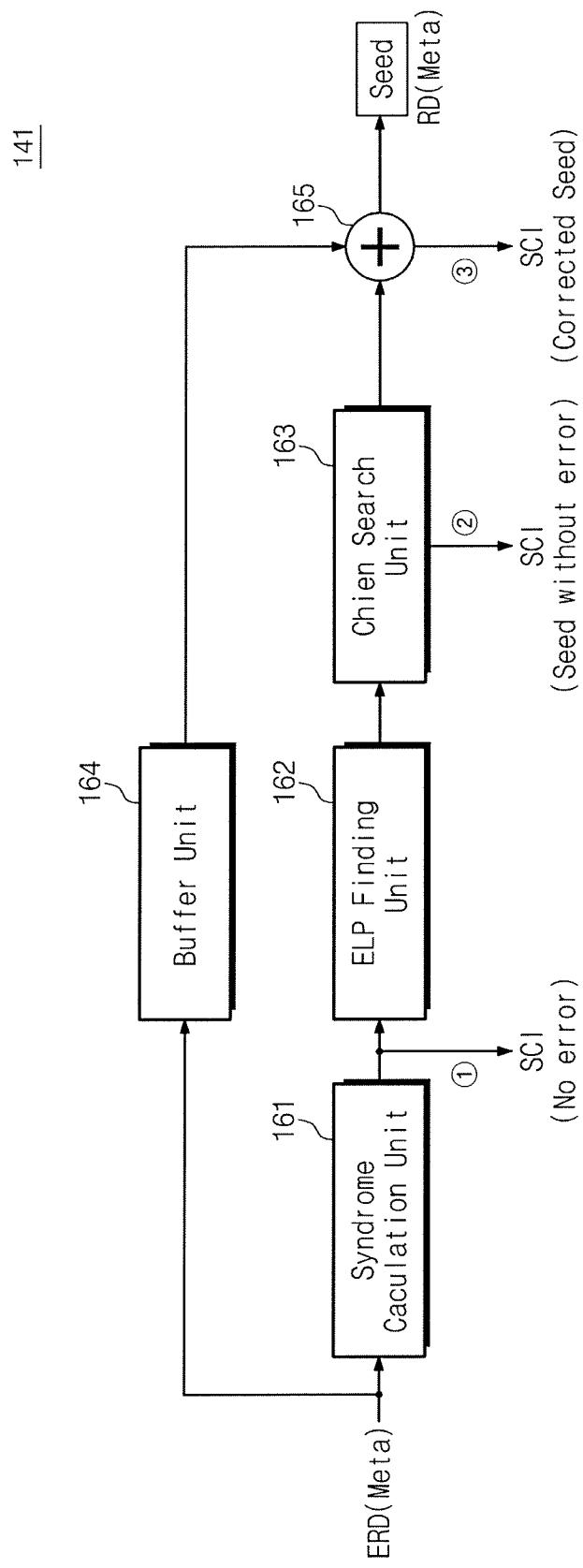
FIG. 5 is a block diagram of the meta data decoder in the memory system of FIG. 1 according to an exemplary embodiment of the inventive concept.

FIG. 5 is a block diagram of the meta data decoder in the memory system of FIG. 1 according to an exemplary embodiment of the inventive concept. Referring to FIG. 5, a meta data decoder 141 includes a Syndrome Calculation Unit 161, an error location polynomial (ELP) finding unit 162, a Chien Search unit 163, a buffer unit 164, and an Adder 165.

The Syndrome Calculation Unit 161 calculates a syndrome of encoded meta data ERD(Meta) for error checking. For example, the syndrome may be calculated by multiplying the encoded meta data ERD(Meta) with a parity bit detection polynomial. The syndrome may include overall information for detecting and correcting an error included in the encoded meta data ERD(Meta). The Syndrome Calculation Unit 161 judges (detects) whether an error exists. For example, if no error exists, the syndrome may have a value of '0'. On the other hand, if an error exists, the syndrome may have a non-zero value.

In an exemplary embodiment, the Syndrome Calculation Unit 161 may be configured to seed confirmation information SCI when no error is detected from the encoded meta data ERD(Meta) as represented by ①.

The error location polynomial (ELP) finding unit 162 finds an error location polynomial ELP using the calculated syndrome.

The Chien Search unit 163 calculates locations of error bits by calculating roots of the error location polynomial using a Chien Search algorithm.

In an exemplary embodiment, the Chien Search unit 163 makes a forward Chien search operation.

In another exemplary embodiment, the Chien Search unit 163 may make a backward Chien search operation.

In an exemplary embodiment, the Chien Search unit 163 may be configured to generate seed confirmation information SCI when the seed does not include an error as represented by ②.

The buffer unit 164 temporarily buffers the encoded meta data ERD(Meta).

The Adder 165 decodes meta data RD(Meta) including a seed by correcting encoded meta data ERD(Meta) in the buffer unit 164 using location information of error bits provided from the Chien Search unit 163.

In an exemplary embodiment, if the seed is erroneous, the Adder 165 may correct an error of the seed to then generate seed confirmation information SCI as represented by ③.

The meta data decoder 141 generates seed confirmation information SCI (①, ②, ③) when a seed is judged to be erroneous or when it is corrected.

The meta data decoder 141 may further include constituent elements and additional functions/operations which are in more detail disclosed in U.S. Patent Publication Nos. 2008/0244362 and 2009/0217140, the entirety of which are incorporated by reference herein.

Figure 6:
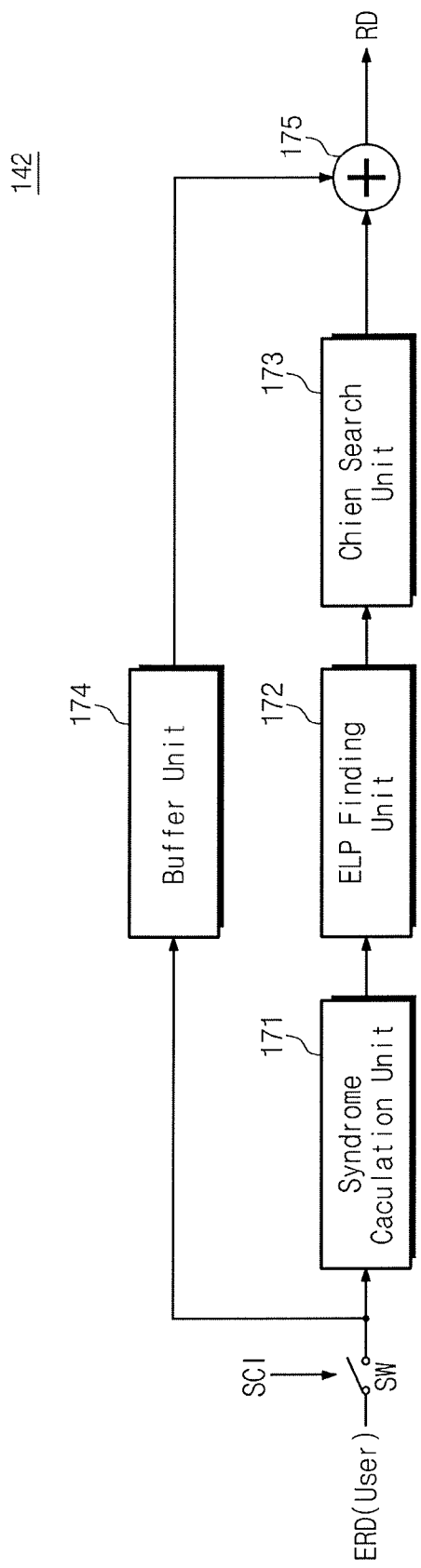
FIG. 6 is a block diagram of the user data decoder in the memory system of FIG. 1 according to an exemplary embodiment of the inventive concept.

FIG. 6 is a block diagram of the user data decoder in the memory system of FIG. 1 according to an exemplary embodiment of the inventive concept.

Referring to FIG. 6, a user data decoder 142 includes a Syndrome Calculation Unit 171, an error location polynomial (ELP) finding unit 172, a Chien Search unit 173, a buffer unit 174, and an Adder 175.

The Syndrome Calculation Unit 171 calculates a syndrome of encoded user data ERD(User). Herein, the encoded user data ERD(User) may be provided to the Syndrome Calculation Unit 171 in response to seed confirmation information SCI. In an exemplary embodiment, the user data decoder 142 may further comprises a switch SW configured to transfer the encoded user data ERD(User) to the Syndrome Calculation Unit 171 in response to the seed confirmation information SCI.

The error location polynomial (ELP) finding unit 172 may find an error location polynomial ELP using the calculated syndrome.

The Chien search unit 173 calculates locations of error bits by calculating roots of the error location polynomial using a Chien search algorithm.

The buffer unit 174 temporarily buffers the encoded user data ERD(User).

The adder 175 decodes user data RD by correcting encoded user data ERD(User) in the buffer unit 174 using location information of error bits provided from the Chien search unit 173.

The user data decoder 142 performs a data output operation more rapidly by receiving encoded user data ERD(User) immediately in response to seed confirmation information SCI and detecting and correcting an error of the encoded user data ERD(User).

Figure 7:
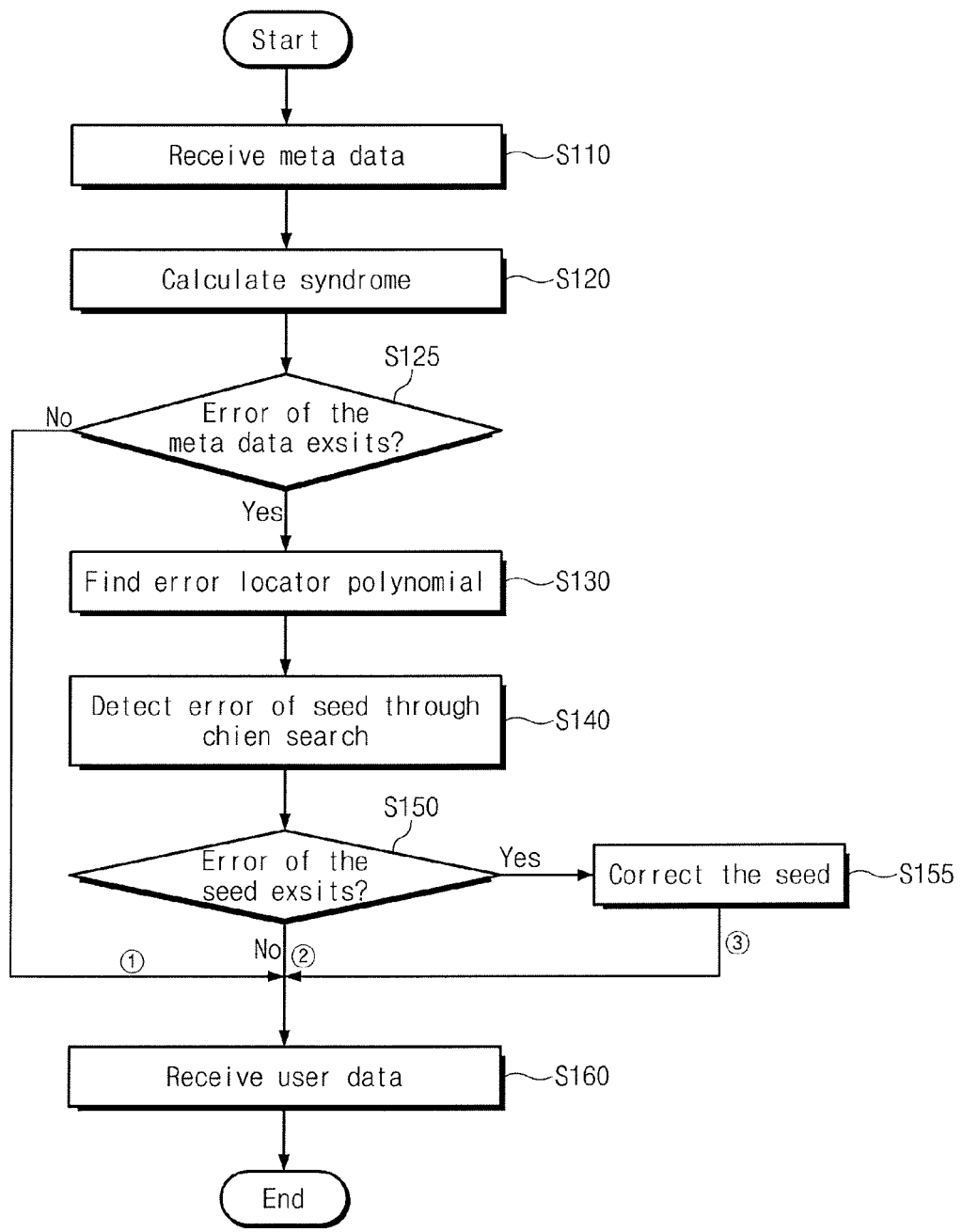
FIG. 7 is a flowchart for describing a data input method of an ECC decoder according to an exemplary embodiment of the inventive concept.

FIG. 7 is a flowchart for describing a data input method of an ECC decoder according to an exemplary embodiment of the inventive concept. Below, a data input method of an ECC decoder according to an exemplary embodiment of the inventive concept will be more fully described with reference to FIGS. 1 to 7.

In step S110, an ECC decoder 132 firstly receives encoded meta data ERD(Meta) from a nonvolatile memory device 110 during a data output operation. In step S120, the ECC decoder 132 calculates a syndrome from the input encoded meta data ERD(Meta).

In step S125, whether the encoded meta data ERD(Meta) is erroneous may be judged according to the calculated syndrome. For example, if the calculated syndrome has a value of '0', no error may exist (NO branch of decision step S125), and in this case, the ECC decoder 132 may generate seed confirmation information SCI and, the method proceeds step S160.

If the encoded meta data ERD(Meta) is judged to be erroneous (YES branch of decision step S125), the method proceeds to step S130, in which the ECC decoder 132 may find an error location polynomial using the calculated syndrome. Afterwards, in operations S140 and S150, the ECC decoder 132 may judge whether a seed in the encoded meta data ERD(Meta) is erroneous (decision step S150), using Chien search. Herein, whether a seed is erroneous may be judged firstly regardless of whether Chien search is forward Chien search or backward Chien search. If the seed is judged not to be erroneous (NO branch of decision step S150), the ECC decoder 132 generates seed confirmation information SCI and the method proceeds to step S160.

If the seed is judged to be erroneous (YES branch of decision step S150), the method may proceed to step S155, in which the ECC decoder 132 corrects an error of the seed and then generates seed confirmation information SCI. Afterwards, the method may proceed to step S160.

In step S160, the ECC decoder 132 receives encoded user data ERD(User) based upon the seed confirmation information SCI.

The ECC decoder 132 according to an exemplary embodiment of the inventive concept may receive encoded user data ERD(User) immediately based upon whether meta data ERD (Meta) is erroneous, whether a seed is erroneous, or whether an error is corrected.

Figure 8:
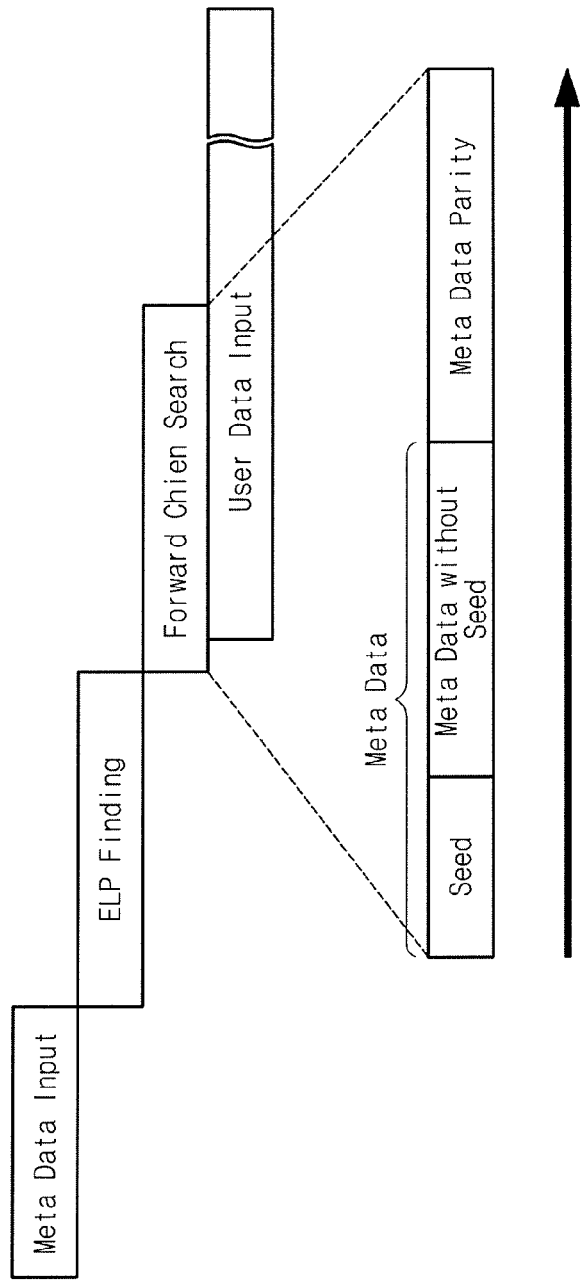
FIG. 8 is a diagram for describing an error correction method of an ECC decoder according to an exemplary embodiment of the inventive concept.

FIG. 8 is a diagram for describing an error correction method of an ECC decoder according to an exemplary embodiment of the inventive concept. In FIG. 8, there is shown an exemplary forward Chien search operation performed when no error is included in meta data. Referring to FIGS. 1 and 8, a meta data decoder 141 calculates the syndrome of input encoded meta data ERD(Meta) and may find an error location polynomial using the calculated syndrome. In an exemplary embodiment, the syndrome calculation may be made at the same time with an input of the encoded meta data ERD(Meta). Afterwards, the meta data decoder 141 conducts forward Chien search to find both an error of the encoded meta data ERD(Meta) and error locations.

Herein, the encoded meta data ERD(Meta), as illustrated in FIG. 8, may include meta data and a meta data parity (bits), and the meta data may include a seed and meta data other than the seed. In the event that the meta data decoder 141 uses forward Chien search, the seed may be located at a front portion of the meta data.

Since it is assumed that the encoded meta data ERD(Meta) does not include an error, the meta data decoder 141 may early find that the seed is not erroneous, at the forward Chien search operation. During the forward Chien search operation, the meta data decoder 141 may generate seed confirmation information SCI indicating that the seed is not erroneous and may send the seed confirmation information SCI to the user data decoder 142. Afterwards, the user data decoder 142 receives encoded user data ERD(User) immediately based upon the seed confirmation information SCI.

A memory system 10 according to an exemplary embodiment of the inventive concept may be configured to early judge whether a seed is erroneous and to provide encoded user data ERD(User) to the user data decoder 142. Accordingly, it is possible to minimize an idle cycle. This means that a data transfer speed is improved.

Figure 9:
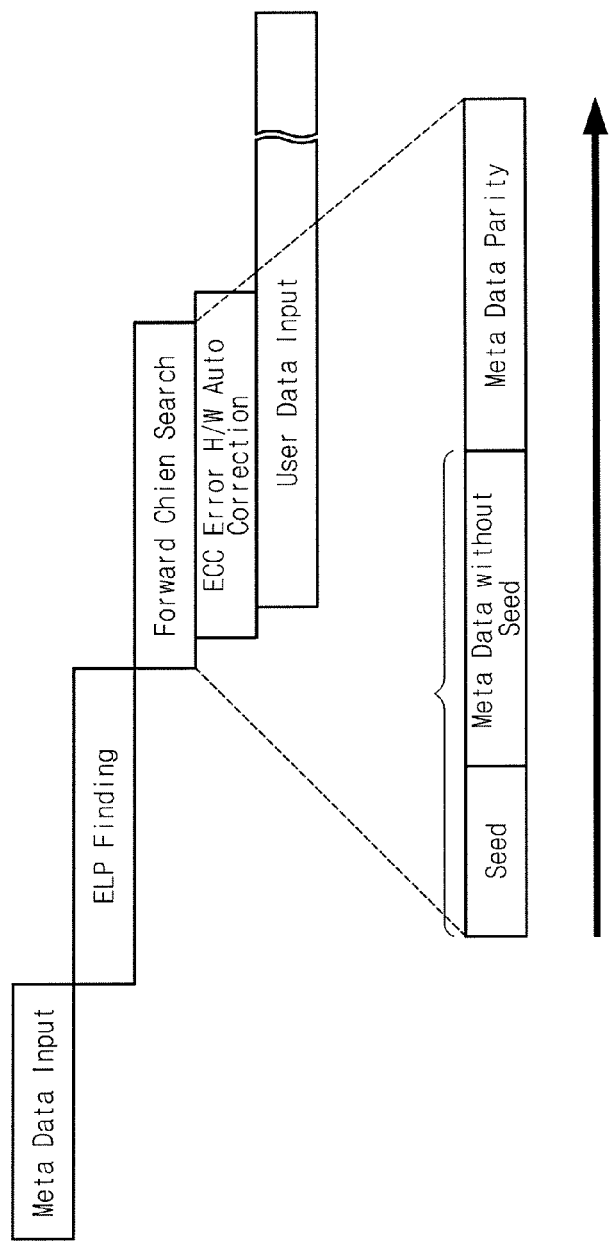
FIG. 9 is a diagram for describing an error correction method of an ECC decoder according to an exemplary embodiment of the inventive concept.

FIG. 9 is a diagram for describing an error correction method of an ECC decoder according to an exemplary embodiment of the inventive concept. In FIG. 9, there is shown an exemplarily forward Chien search operation performed when an error is included in meta data. It is assumed that encoded meta data ERD(Meta) is erroneous. An error correction operation may be performed differently according to whether an error is an error of a seed or an error of meta data other than the seed.

First of all, when an error is detected from not a seed but from meta data other than the seed during a forward Chien search operation, an error correction operation may be performed as follows: At the forward Chien search operation, a meta data decoder 141 may early find that the seed is not erroneous; During the forward Chien search operation, the meta data decoder 141 generates seed confirmation information SCI indicating that the seed is not erroneous and may send the seed confirmation information SCI to a user data decoder 142; Afterwards, the user data decoder 142 receives encoded user data ERD(User) immediately based upon the seed confirmation information SCI.

At the same time (or, in parallel), since meta data other than a seed is erroneous, the meta data decoder 141 may correct a bit at an error location in hardware. And then, when a seed is judged to be erroneous at the forward Chien search operation, an error correction operation may be performed as follows: During the forward Chien search operation, the meta data decoder 141 may firstly correct an error of the seed; After error correction, the meta data decoder 141 generates seed confirmation information SCI to sends it to the user data decoder 142; Afterwards, the user data decoder 142 receives encoded user data ERD(User) immediately based upon the seed confirmation information SCI.

A memory system 10 according to an exemplary embodiment of the inventive concept may be configured to early judge whether a seed is erroneous and to provide encoded user data ERD(User) to a user data decoder 142. Accordingly, it is possible to minimize an idle cycle. This means that a data transfer speed is improved.

An error correction method performing a forward Chien search operation is described with reference to FIGS. 8 and 9. However, the inventive concept is not limited thereto. An error correction method performing a backward Chien search operation may be applied to the inventive concept.

Figure 10:
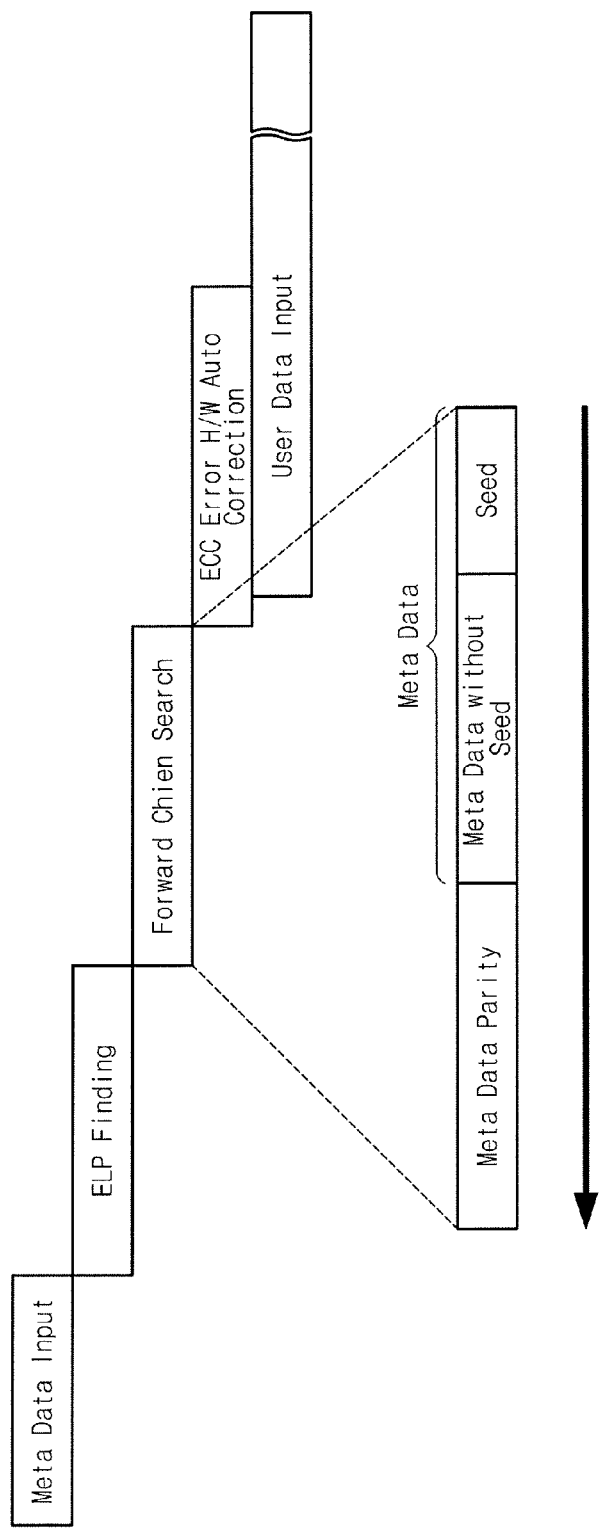
FIG. 10 is a diagram for describing an error correction method of an ECC decoder according to another exemplary embodiment of the inventive concept.

FIG. 10 is a diagram for describing an error correction method of an ECC decoder according to another exemplary embodiment of the inventive concept. In FIG. 10, there is exemplarily shown a backward Chien search operation performed when an error is included in meta data.

The meta data decoder 141 calculates a syndrome of input encoded meta data ERD(Meta) and finds an error location polynomial using the calculated syndrome. Afterwards, the meta data decoder 141 conducts a backward Chien search to find both an error of the encoded meta data ERD(Meta) and error locations. Herein, the encoded meta data ERD(Meta), as illustrated in FIG. 10, may include meta data and a meta data parity (bits), and the meta data may include a seed and meta data other than the seed. In the event that the meta data decoder 141 uses backward Chien search, the seed may be located at a rear portion of the meta data. It is assumed that encoded meta data ERD(Meta) is erroneous. An error correction operation may be performed differently according to whether an error is an error of a seed or an error of meta data other than the seed. First of all, when an error is detected from not a seed but meta data other than the seed during a backward Chien search operation, an error correction operation may be performed as follows: At the backward Chien search operation, a meta data decoder 141 may early find that the seed is not erroneous; During the forward Chien search operation, the meta data decoder 141 may generate seed confirmation information SCI indicating that the seed is not erroneous and may send the seed confirmation information SCI to a user data decoder 142; Afterwards, the user data decoder 142 may receive encoded user data ERD(User) immediately based upon the seed confirmation information SCI.

At the same time (or, in parallel), since meta data other than a seed is erroneous, the meta data decoder 141 may correct a bit at an error location in hardware.

And then, when a seed is judged to be erroneous at the backward Chien search operation, an error correction operation may be performed as follows: During the backward Chien search operation, the meta data decoder 141 may firstly correct an error of the seed; After error correction, the meta data decoder 141 may generate seed confirmation information SCI to send it to the user data decoder 142; Afterwards, the user data decoder 142 may receive encoded user data ERD(User) immediately based upon the seed confirmation information SCI.

A memory system 10 according to an exemplary embodiment of the inventive concept may be configured to early judge whether a seed is erroneous and to provide encoded user data ERD(User) to a user data decoder 142. Accordingly, it is possible to minimize an idle cycle. This means that a data transfer speed is improved.

A memory system 10 illustrated in FIGS. 1 to 10 may manage encoded randomized data ERD by randomizing data and generating ECC corresponding to the randomized data. However, the inventive concept is not limited thereto. A memory system according to an exemplary embodiment of the inventive concept can be configured to manage encoded randomized data ERD by generating ECC corresponding to data and then conducting randomization on the ECC and data.

Figure 11:
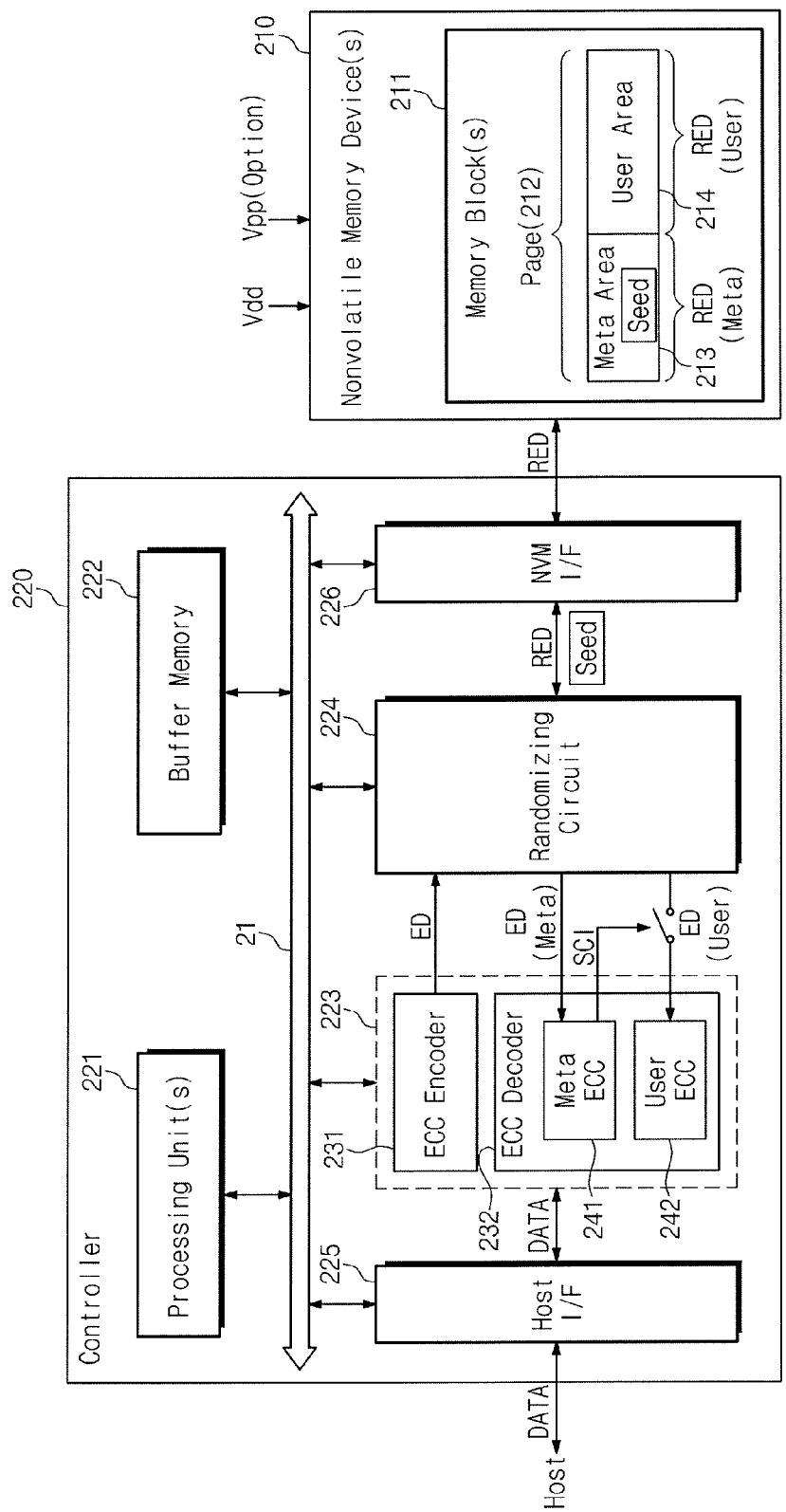
FIG. 11 is a block diagram of a memory system according to another exemplary embodiment of the inventive concept.

FIG. 11 is a block diagram of a memory system according to another exemplary embodiment of the inventive concept. A memory system 20 may be configured to manage randomized encoded data RED. Referring to FIG. 11, the memory system 20 includes at least one nonvolatile memory device 210 and a memory controller 220 controlling the nonvolatile memory device 210.

The nonvolatile memory device 210 may be configured the same as a nonvolatile memory device 110 in FIG. 1. The nonvolatile memory device 210 may be configured to input and output randomized encoded data RED. The nonvolatile memory device 210 included at least one memory block 211. The memory block 211 includes a plurality of pages (not shown). Each page 212 includes a meta area 213 and a user area 214. The meta area 213 may include randomized meta data RED(Meta). Herein, the randomized meta data RED (Meta) may include a seed used to randomize the page 212.

The memory controller 220 may be configured to input and output data according to commands from an external host. The memory controller 220 may be configured to control the nonvolatile memory device 210. For example, in response to a host request, the memory controller 220 may generate an error correction code corresponding to input data, and may conduct randomization on the input data and the error correction code using a seed to output randomized encoded data RED to the nonvolatile memory device 210. Herein, the randomized encoded data RED may include a seed for execution of a randomization operation.

The memory controller 220 may include at least one processing unit 221, a buffer memory 222, an ECC circuit 223, a randomizing circuit 224, a host interface 225, and a nonvolatile memory interface 226. Herein, the elements 221 to 226 may be configured the same as those in FIG. 1.

While encoding, the ECC circuit 223 receives data to output encoded data ED. While decoding, the ECC circuit 223 may recover user data and meta data by detecting or correcting an error of encoded data ED(Meta) and ED(User). Herein, the decoding may include the first decoding operation of the encoded meta data ED(Meta) and the second decoding operation of the encoded user data ED(User). The second decoding operation may be made in response to seed confirmation information SCI associated with whether a seed is erroneous or whether an error is corrected, at the first decoding operation.

The ECC circuit 223 includes an ECC encoder circuit 231 and an ECC decoder circuit 232.

The ECC encoder 231 generates parities by encoding input data. At this time, the input data and the parities may constitute encoded data ED.

The ECC decoder 232 includes a meta data decoder 241 and a user data decoder 242.

The meta data decoder 241 performs the first decoding operation. Thus, the meta data decoder 241 conducts error detection or correction on encoded meta data ED(Meta). During the first decoding operation, the meta data decoder 241 may firstly judge an error of a seed in the encoded meta data ED(Meta) and error correction and generates seed confirmation information SCI according to the judgment result.

The user data decoder 242 performs the second decoding operation. Thus, the user data decoder 242 receives encoded user data ED(User) in response to the seed confirmation information SCI to make error detection or correction on the encoded user data ED(User).

The randomizing circuit 224 generates randomized encoded data RED by randomizing input data and its parity using a seed. The randomizing circuit 224 may include a de-randomizing circuit portion and/or execute firmware configured to generate the data by de-randomizing the randomized encoded data RED using the seed. The randomized encoded data RED may include a seed indicating the specific randomization performed.

The memory system 20 according to an exemplary embodiment of the inventive concept generates seed confirmation information SCI by judging an error of a seed or by correcting it, during the first decoding operation, and can perform the second decoding operation immediately in response to the seed confirmation information SCI. Accordingly, the memory system 20 can reduce a wait time of user data ED(User) as compared with a conventional memory system.

In FIGS. 1 to 11, there are shown in the exemplary cases that randomizing circuits 113 and 224 are provided within memory controllers 120 and 220, respectively. However, the inventive concept is not limited thereto. A randomizing circuit can be provided within a nonvolatile memory device.

Figure 12:
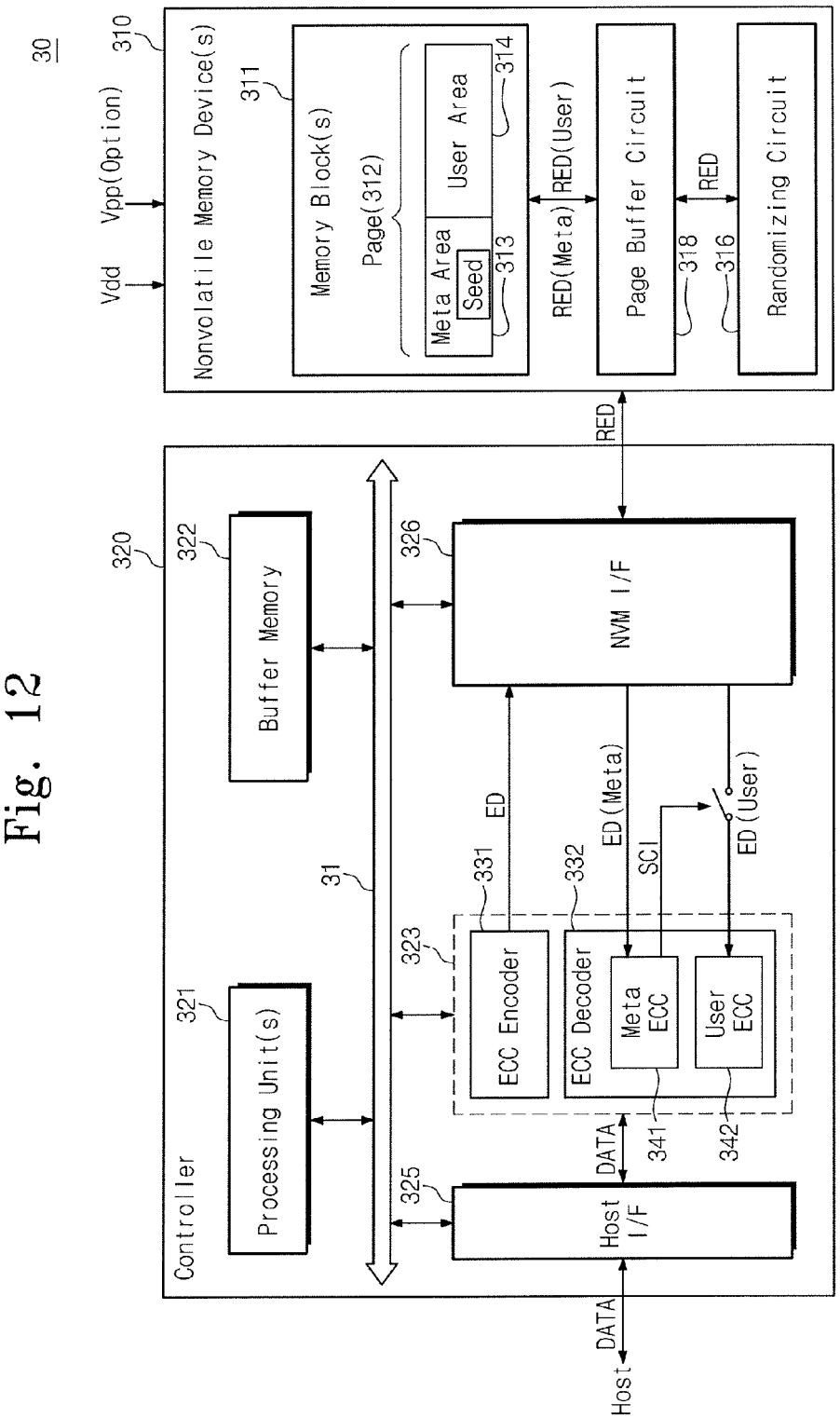
FIG. 12 is a block diagram of a memory system according to still another exemplary embodiment of the inventive concept.

FIG. 12 is a block diagram of a memory system according to still another exemplary embodiment of the inventive concept. Referring to FIG. 12, a memory system 30 includes at least one nonvolatile memory device 310 and a memory controller 320 controlling the nonvolatile memory device 310.

The nonvolatile memory device 310 may be configured functionally and operationally the same as that in FIG. 1. The nonvolatile memory device 310 may be configured to input and output encoded data ED. The encoded data ED may include data and its parity (bits).

The nonvolatile memory device 310 may include at least one memory block 311, a randomizing circuit 316, and a page buffer circuit 318.

The memory block 311 may include a plurality of pages (not shown). Each page 312 may include a meta area 313 and a user area 314. In particular, randomized meta data RED (Meta) may include a seed used to randomize the page 312. The user area 314 may include randomized user data RED (User).

The randomizing circuit 316 randomizes encoded data ED using a seed during a write operation or may de-randomize randomized encoded data RED using a seed during a read operation. An exemplary randomizing circuit is described in detail in U.S. Pat. No. 7,212,426 and U.S. Patent Publication Nos. 2010/0229001, 2010/0229007, and 2010/0259983, the entirety of which are incorporated by reference herein.

The page buffer circuit 318 stores randomized encoded data (RED(Meta) and RED(User)) in a page corresponding to an input address during a write operation and may read randomized encoded data (RED(Meta), RED(User)) from a page corresponding to an input address during a read operation. An exemplary page buffer circuit is described in detail in U.S. Pat. No. 7,379,333, the entirety of which is incorporated by reference herein.

The memory controller 320 inputs and outputs data according to a request of an external host. The memory controller 320 controls the nonvolatile memory device 310. For example, in response to a host request during an input operation, the memory controller 320 generates an error correction code corresponding to input data to output encoded data ED to the nonvolatile memory device 310. In response to a host request during an output operation, the memory controller 320 corrects an error of encoded data ED read from a page of the nonvolatile memory device 310 to output it to the external host.

The memory controller 320 includes at least one processing unit 321, a buffer memory 322, an ECC circuit 323, a host interface 325, and a nonvolatile memory interface 326. The elements 321 to 326 in FIG. 12 may be configured functionally and operationally the same as that in FIG. 1. Herein, the ECC circuit 323 may be configured the same as that in FIG. 11.

The ECC circuit 323 includes an ECC encoder 331 and an ECC decoder 332. The ECC decoder 332 includes a meta data decoder 341 and a user data decoder 342.

The memory system 30 according to an exemplary embodiment of the inventive concept generates seed confirmation information SCI by judging an error of a seed or by correcting it, during the first decoding operation, and may perform the second decoding operation immediately in response to the seed confirmation information SCI. Accordingly, the memory system 30 can reduce the wait time of user data ED(User) as compared with a conventional memory system.

In FIGS. 1 to 12, there are shown the exemplary cases that ECC circuits 114, 223, and 323 are provided within memory controllers 120, 220, and 330 respectively. However, the inventive concept is not limited thereto. An ECC circuit can be provided within a nonvolatile memory device.

Figure 13:
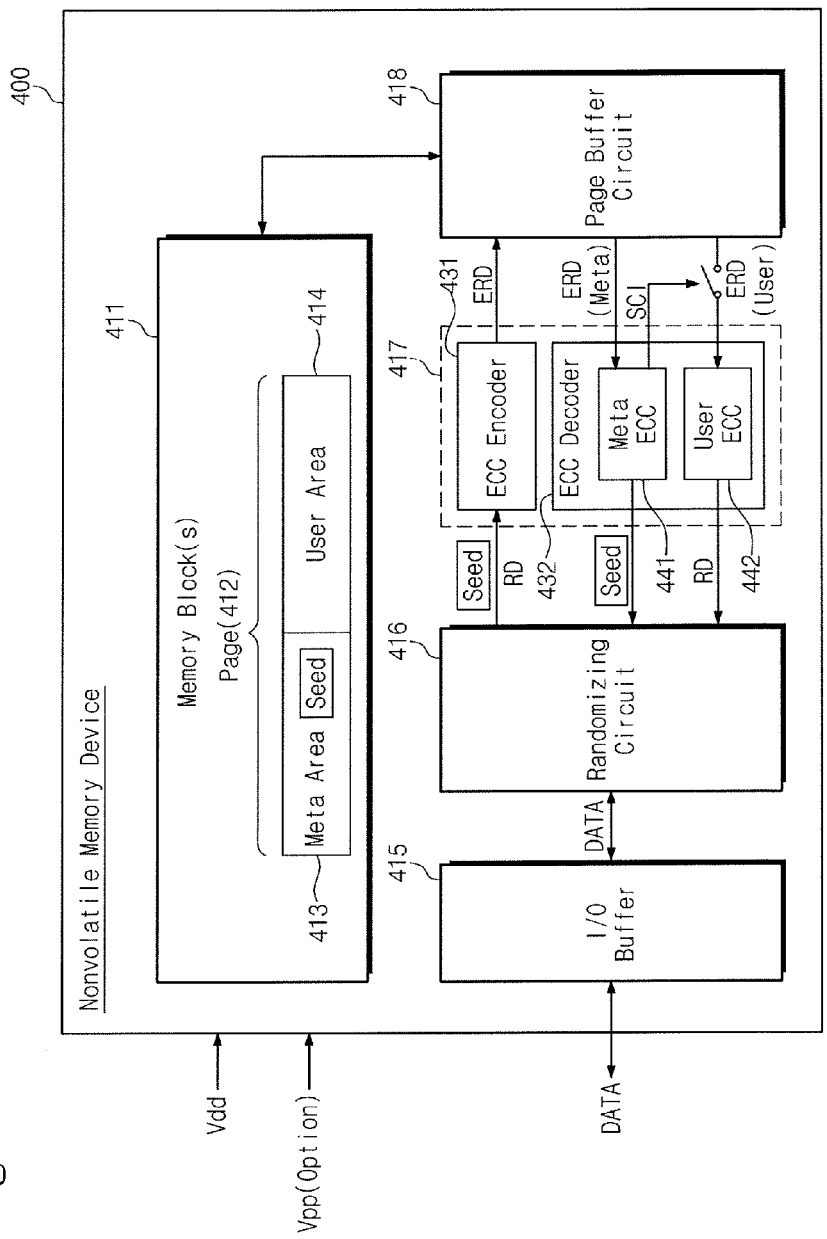
FIG. 13 is a block diagram of a nonvolatile memory device according to an exemplary embodiment of the inventive concept.

FIG. 13 is a block diagram of a nonvolatile memory device according to an exemplary embodiment of the inventive concept. Referring to FIG. 13, a nonvolatile memory device 400 includes at least one memory block 411, an input/output buffer 415, a randomizing circuit 416, an ECC circuit 417, and a page buffer circuit 418.

The memory block 411 may be configured the same as that in FIG. 1. The memory block 411 may include a plurality of pages (not shown). Each page 412 may include a meta area 413 and a user area 414.

The input/output circuit 415 inputs data to be stored during a write operation and may output read data to an external device during a read operation.

The randomizing circuit 416 may be configured functionally and operationally the same as that in FIG. 1. The randomizing circuit 416 randomizes data using a seed during a write operation and de-randomizes randomized data using a seed during a read operation.

The ECC circuit 417 may be configured functionally and operationally the same as that in FIG. 1.

The page buffer circuit 418 stores encoded randomized data (ERD(Meta) and ERD(User)) in a page corresponding to an input address during a write operation and reads encoded randomized data (ERD(Meta), ERD(User)) from a page corresponding to an input address during a read operation. The page buffer circuit 418 may be configured to output encoded meta data ERD(Meta) and encoded user data ERD(User) independently during an output operation.

The nonvolatile memory device 400 can improve the reliability of data by storing and managing randomized data.

Figure 14:
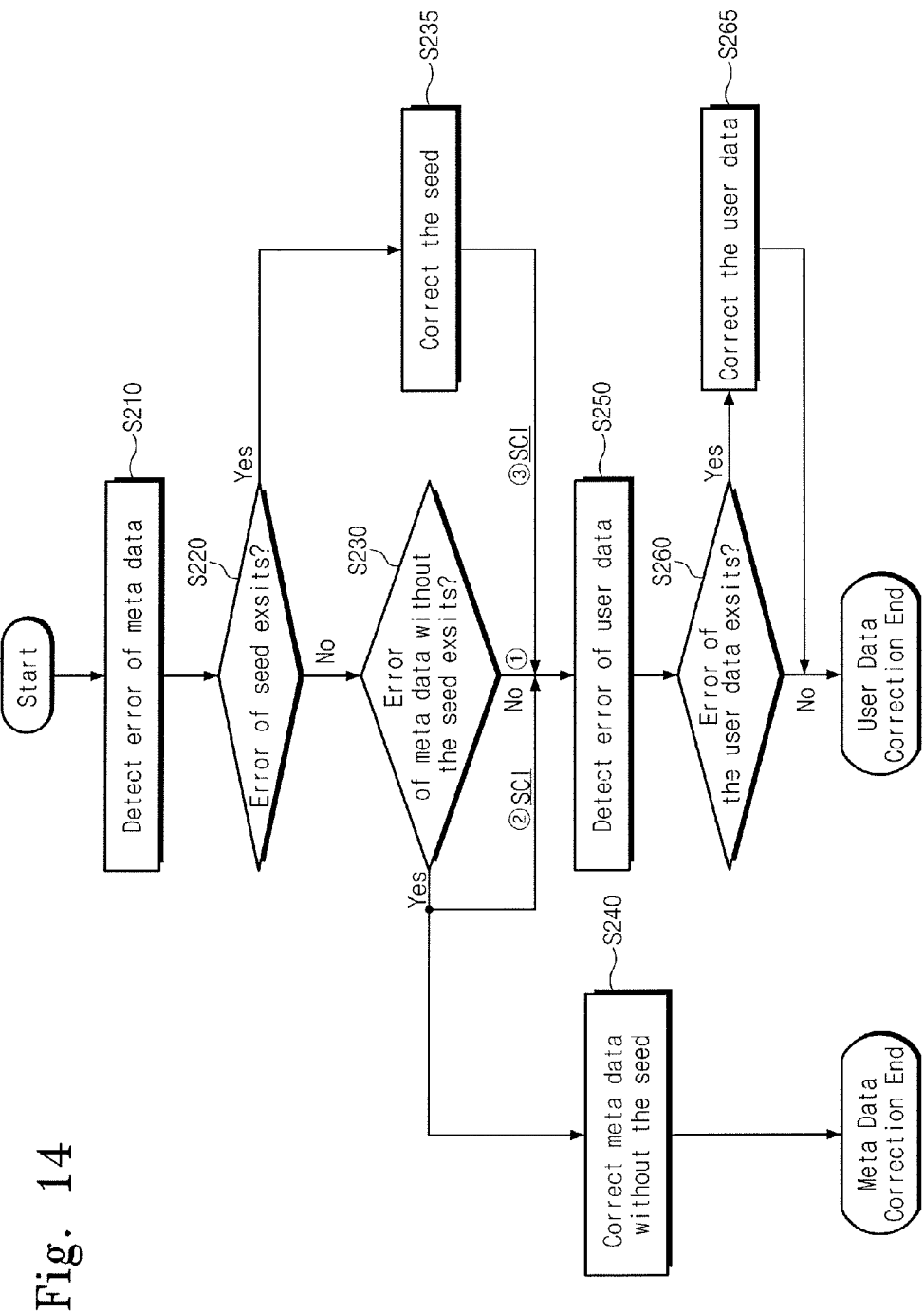
FIG. 14 is a flowchart for describing an error correction method according to an exemplary embodiment of the inventive concept.

FIG. 14 is a flowchart for describing an error correction method according to an exemplary embodiment of the inventive concept. For ease of description, an error correction method of an ECC circuit 124 in FIG. 1 will be described below.

In step S210, the ECC circuit 124 may detect an error of input meta data. The meta data may include a seed for randomization. It is assumed that error detection on the seed is made firstly.

In decision step S220, the ECC circuit 124 judge whether the seed is erroneous, from the input meta data.

If the seed is judged to be not erroneous (NO branch of decision step S220), in decision step S230, the ECC circuit 124 generates seed confirmation information SCI (②) and judges whether an error is included in non-seed meta data (i.e., meta data other than the seed). If the seed is judged to be erroneous (YES branch of decision step S220), in step S235, the ECC circuit 124 corrects an error of the seed and generates seed confirmation information SCI (③). In the event that an error is included in meta data other than the seed (YES branch of decision step S230), in step S240, an error of the meta data other than the seed may be corrected. Thus, error correction on meta data may be completed.

If the seed is judged to be erroneous (YES branch of decision step S220), the ECC circuit 124 may correct the error of the seed and generate seed confirmation information SCI (③).

In step S250, the ECC circuit 124 receives and detects and error in user data based upon seed confirmation information (②, ③) associated with whether a seed is erroneous or whether an error is corrected.

In decision step S260, the ECC circuit 124 judges whether user data is erroneous.

If the user data is judged not to be erroneous (NO branch of decision step S260), the ECC circuit 124 outputs the input user data without modification.

On the other hand, if the user data is judged to be erroneous (YES branch of decision step S260), in step S265, the ECC circuit 124 may correct the error of the user data. The above-described error correction on the user data can be completed.

According to an error correction method of the inventive concept, while meta data is being corrected, user data can also be corrected. Accordingly, it is possible to reduce an idle cycle (or a wait time) needed for processing user data during an error correction operation.

Figure 15:
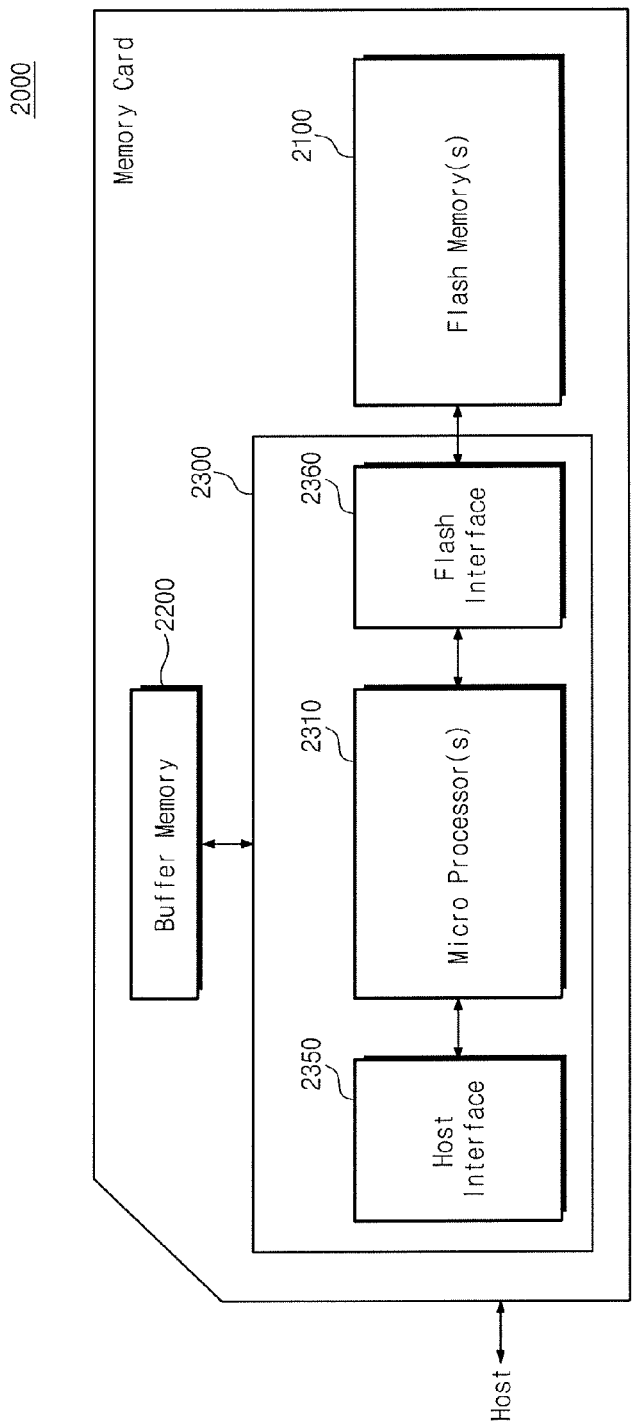
FIG. 15 is a block diagram of a memory card according to an exemplary embodiment of the inventive concept.

FIG. 15 is a block diagram of a memory card according to an exemplary embodiment of the inventive concept. Referring to FIG. 15, a memory card 2000 includes a flash memory device 2100, a buffer memory device 2200, and a memory controller 2300 for controlling the flash memory device 2100 and the buffer memory device 2200. The memory card 2000 may be one of memory systems 10, 20, and 30 in FIGS. 1, 11, and 12 and a nonvolatile memory device 400 in FIG. 13.

The flash memory device 2100 may include the same configuration and/or operation of any one of nonvolatile memory devices 110, 210, 310, and 400 in FIGS. 1, 11, 12, and 13.

The buffer memory device 2200 may be used for temporarily storing data generated during an operation of the memory card 2000. The buffer memory device 2200 may be formed of a DRAM or an SRAM.

The memory controller 2300 may be connected between a host and the flash memory device 2100. The memory controller 2300 may access the flash memory device 2100 in response to a request from the host. The memory controller 2300 may include the same configuration and/or operation of any one of memory controllers 120, 220, and 320 in FIGS. 1, 11, and 12 and a memory controller controlling a nonvolatile memory device 400 in FIG. 13.

The memory controller 2300 includes at least one microprocessor 2310, a host interface 2350, and a flash interface 2360. The microprocessor 2310 may be configured to execute firmware. The host interface 2350 may interface with the host via a card protocol (e.g., SD/MMC) for data exchanges between the host and the memory card 2000.

The memory card 2000 may implemented as a Multimedia Card (MMCs), a Security Digital (SD) card, a miniSD card, a memory stick, smartmedia card, and a transflash card.

An exemplary memory card is described in detail in U.S. Patent Publication No. 2010/0306583, the entirety of which is incorporated by reference herein.

Figure 16:
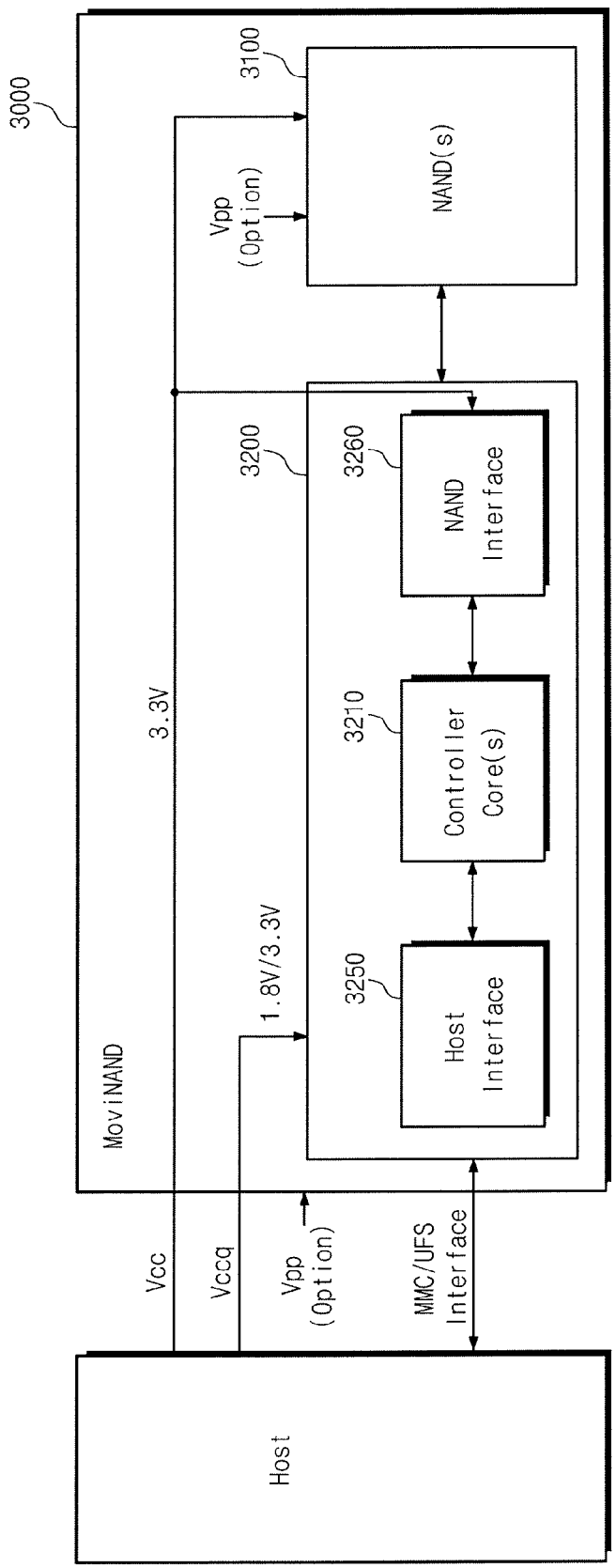
FIG. 16 is a block diagram of a moviNAND device according to an exemplary embodiment of the inventive concept.

FIG. 16 is a block diagram of a moviNAND device according to an exemplary embodiment of the inventive concept. Referring to FIG. 16, a moviNAND device 3000 includes a NAND flash memory device 3100 and a controller 3200. The moviNAND device 3000 may support the MMC 4.4 (called eMMC) standard. The moviNAND device 3000 may be one of memory systems 10, 20, and 30 in FIGS. 1, 11, and 12 and a nonvolatile memory device 400 in FIG. 13.

The at least one NAND flash memory device 3100 may include the same configuration and/or operation of any one of nonvolatile memory devices 110, 210, 310, and 400 in FIGS. 1, 11, 12, and 13. In an exemplary embodiment, the NAND flash memory device 3100 may be an SDR (single data rate) or DDR (double data rate) NAND flash memory device. The NAND flash memory device 3100 may include unitary NAND flash memories, which are stacked in one package (e.g., Fine-pitch Ball Grid Array (FBGA)).

The memory controller 3200 may include the same configuration and/or operation of any one of memory controllers 120, 220, and 320 in FIGS. 1, 11, and 12 and a memory controller controlling a nonvolatile memory device 400 in FIG. 13. The memory controller 3200 includes at least one controller core 3210, a host interface 3250, and a NAND interface 3260. The controller core 3210 may control the overall operation of the moviNAND device 3000.

The host interface 3250 may be configured to interface between the controller 3200 and a host. The NAND interface 3260 may be configured to interface between the NAND flash memory device 3100 and the memory controller 3200. In an exemplary embodiment, the host interface 3250 may be a parallel interface (e.g., an MMC interface). In another exemplary embodiment, the host interface 3250 of the moviNAND device 3000 may be a serial interface (e.g., UHS-II, UFS interface, etc.).

The moviNAND device 3000 may receive the first and second power supply voltages Vcc and Vccq from the host. Herein, the first power supply voltage Vcc (about 3.3V) may be supplied to the NAND flash memory device 3100 and the NAND interface 3260, while the second power supply voltage Vccq (about 1.8V/3.3V) may be supplied to the controller 3200.

The moviNAND device 3000 may be advantageously used to store bulk data and may have an improved read operation characteristic. The moviNAND device 3000 may be advantageously used in low-power and small-sized mobile products (e.g., Galaxy S, iPhone, etc.) serving as the host.

Figure 17:
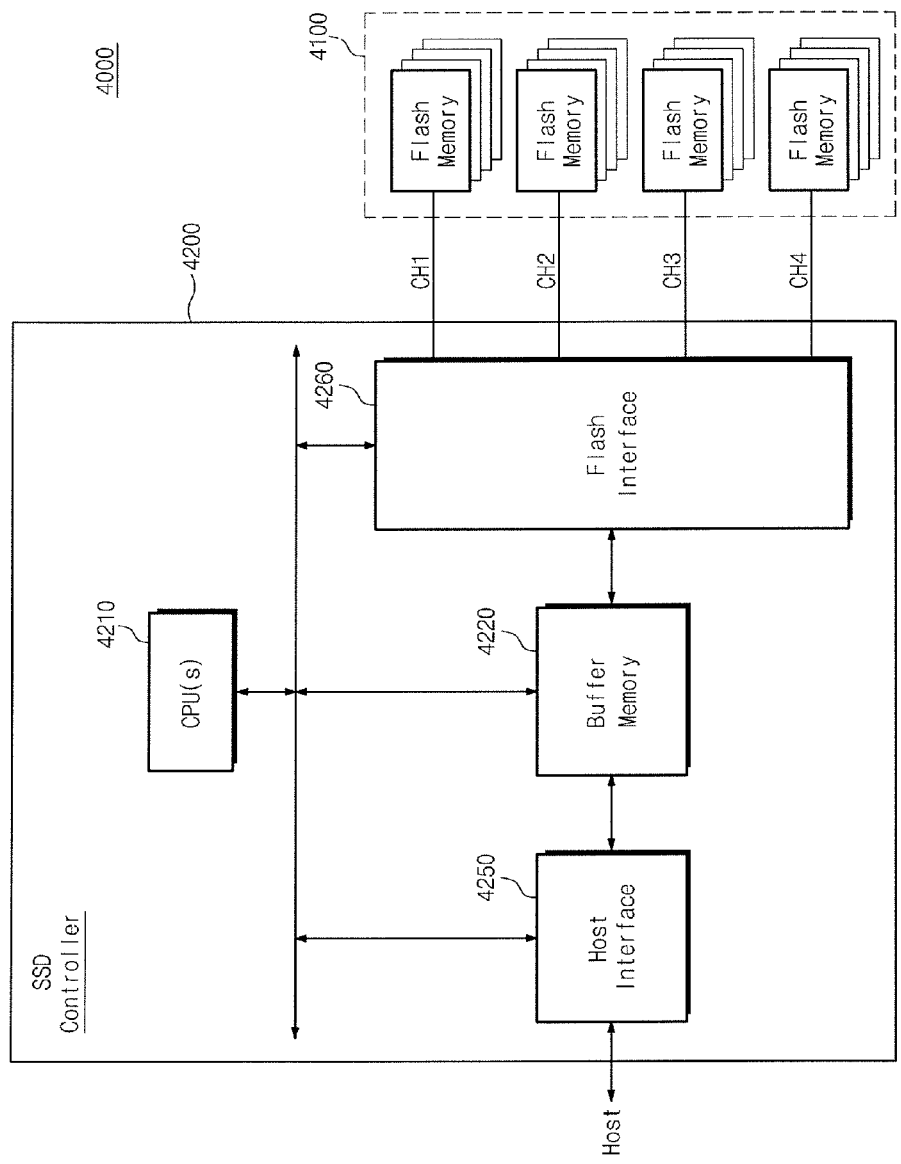
FIG. 17 is a block diagram of an SSD according to an exemplary embodiment of the inventive concept.

FIG. 17 is a block diagram of an SSD (solid state drive) according to an exemplary embodiment of the inventive concept. Referring to FIG. 17, an SSD 4000 may include a plurality of flash memory devices 4100 and an SSD controller 4200.

Each of the flash memory devices may include the same configuration and/or operation of any one of nonvolatile memory devices 110, 210, 310, and 400 in FIGS. 1, 11, 12, and 13.

The SSD controller 4200 may include the same configuration and/or operation of any one of memory controllers 220 and 320 in FIGS. 11 and 12 and a memory controller controlling a nonvolatile memory device 400 in FIG. 13.

The SSD controller 4200 may control the plurality of flash memory devices 4100. The SSD controller 4200 includes a CPU 4210, a buffer memory 4220, a host interface 4250, and a flash interface 4260.

The buffer memory 4220 may be used to temporarily store data transferred between an external device and the flash memory devices 4100. The buffer memory 4220 may be used to store programs to be executed by the CPU 4210. The buffer memory 4220 may be formed of DRAM or SRAM. In FIG. 17, the buffer memory 4220 may be implemented to be included in the SSD controller 4200. However, the inventive concept is not limited thereto. For example, the buffer memory 4220 may be disposed outside the SSD controller 4200.

Under the control of the CPU 4210, the host interface 4250 may exchange data with a host through, for example, the ATA protocol. The ATA protocol may include a Serial Advanced Technology Attachment (SATA) interface, a Parallel Advanced Technology Attachment (PATA) interface, and an External SATA (ESATA) interface, for example.

Data to be received or transmitted from or to the host through the host interface 4250 may be delivered to the buffer memory 4220 without passing through a CPU bus, under the control of the CPU 4210.

The flash interface 4260 may be configured to interface between the SSD controller 4200 and the flash memory devices 4100 that are used as storage devices. The flash interface 4260 may be configured to support at least one of the NAND flash memories, One-NAND flash memories, multi-level flash memories, or single-level flash memories.

The SSD 4000 may improve the reliability of data by storing random data during a program operation. As a result, the SSD 4000 may improve the reliability of stored data. An exemplary SSD is described in detail in U.S. Patent Publication No. 2010/0082890, the entirety of which is incorporated by reference herein.

Figure 18:
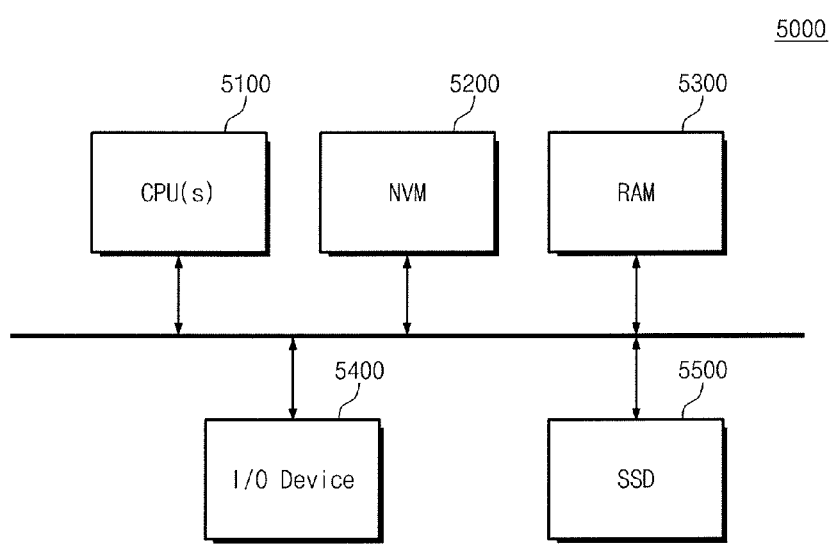
FIG. 18 is a block diagram of a computing system according to an exemplary embodiment of the inventive concept.

FIG. 18 is a block diagram of a computing system according to an exemplary embodiment of the inventive concept. Referring to FIG. 18, a computing system 5000 includes at least one CPU 5100, a nonvolatile memory device 5200, a RAM 5300, an input/output (I/O) device 5400, and an SSD 5500.

The CPU 5100 is connected to a system bus. The nonvolatile memory device 5200 may store data including executable code used to drive the computing system 5000. Herein, the code may include a start command sequence or a basic I/O system (BIOS) sequence. The RAM 5300 may temporarily store data generated during the execution of the CPU 5100.

The I/O device 5400 may be connected to the system bus through an I/O device interface. The I/O device 5400 may include keyboards, pointing devices (e.g., mouse), touch sensors, monitors, and modems.

The SSD 5500 may be a readable storage device and may be implemented the same as an SSD 4000 in FIG. 17.

Figure 19:
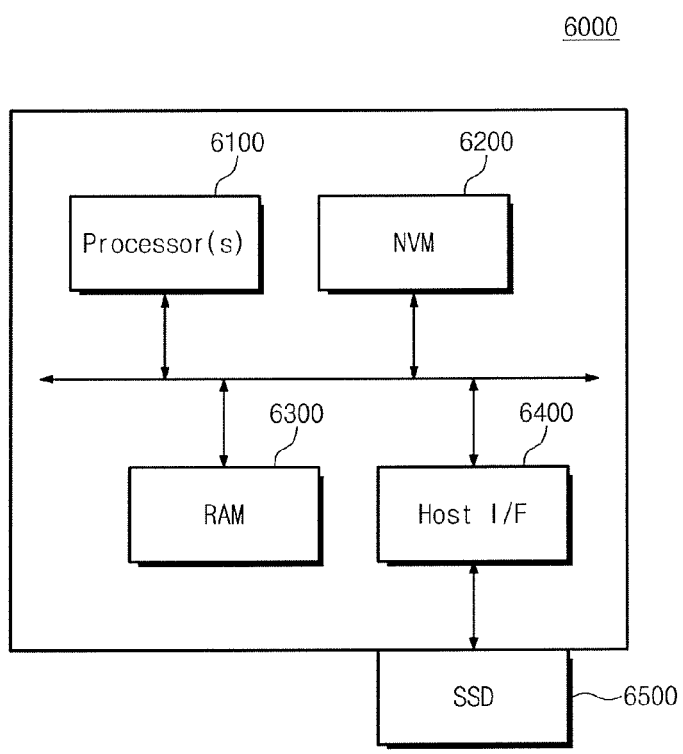
FIG. 19 is a block diagram of an electronic device including an SSD in FIG. 17 according to an exemplary embodiment of the inventive concept.

FIG. 19 is a block diagram of an electronic device including an SSD in FIG. 17 according to an exemplary embodiment of the inventive concept. Referring to FIG. 19, an electronic device 6000 may include a processor 6100, a ROM 6200, a RAM 6300, a flash interface (I/F) 6400, and an SSD 6500.

The processor 6100 may access the RAM 6300 to execute firmware codes or other necessary codes. The processor 6100 may access the ROM 6200 to execute various command sequences such as a start command sequence and a basic I/O system (BIOS) sequence. The flash interface 6400 may be configured to interface between the electronic device 6000 and the SSD 6500.

The SSD 6500 may be detachable from the electronic device 6000. The SSD 6500 may be implemented the same as an SSD 4000 in FIG. 17.

Examples of the electronic device 6000 may include cellular phones, personal digital assistants (PDAs), digital cameras, camcorders, portable audio players (e.g., MP3), and portable media players (PMPs).

Figure 20:
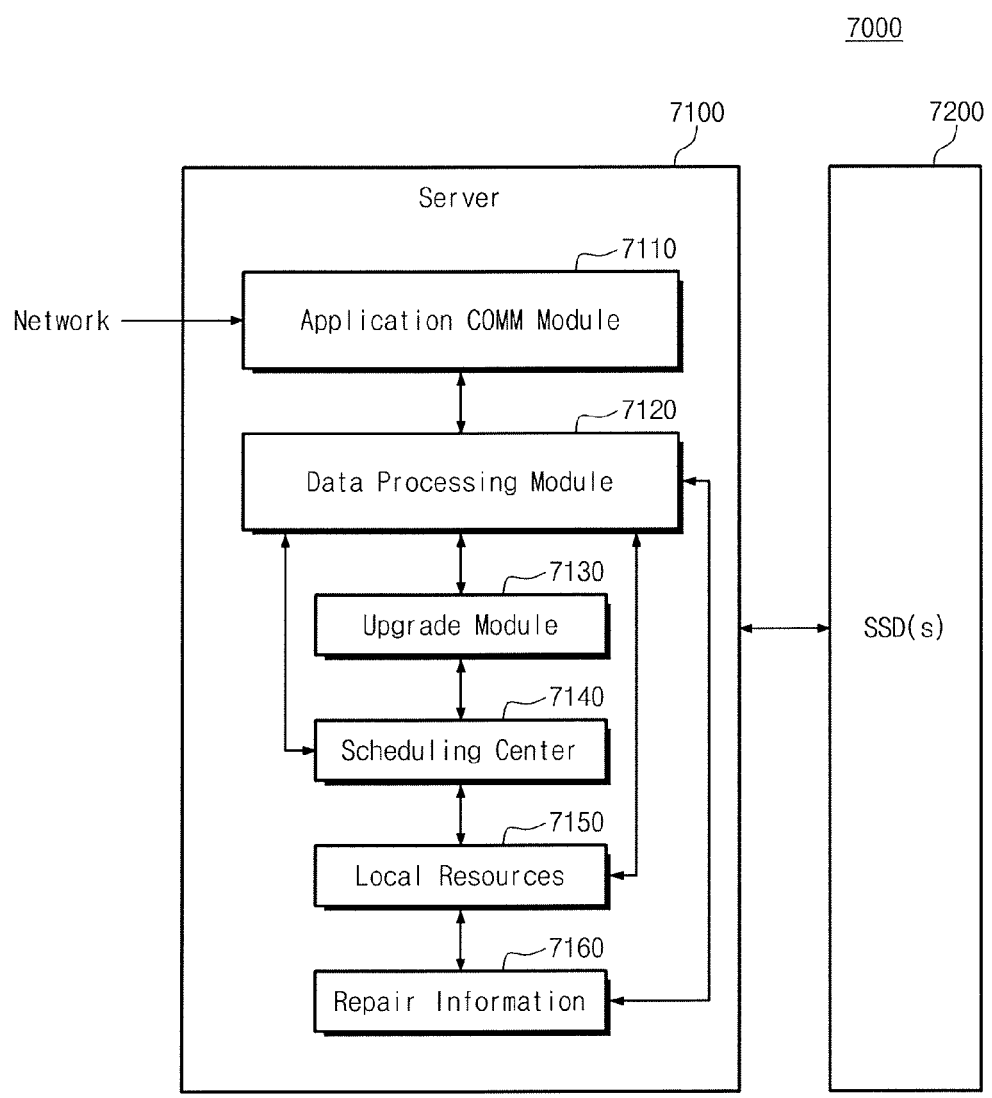
FIG. 20 is a block diagram of a server system including an SSD in FIG. 17 according to an exemplary embodiment of the inventive concept.

FIG. 20 is a block diagram of a server system including an SSD in FIG. 17 according to an exemplary embodiment of the inventive concept. Referring to FIG. 20, a server system 7000 includes a server 7100 and at least one SSD 7200 that stores data including executable code used to drive the server 7100. The SSD 7200 may be configured the same as an SSD 4000 in FIG. 17.

The server 7100 may include an application communication module 7110, a data processing module 7120, an upgrade module 7130, a scheduling center 7140, a local resource module 7150, and a repair information module 7160.

The application communication module 7110 may be configured to communicate with a remote computing system connected to a network and the server 7100, or to allow the server 7100 to communicate with the SSD 7200. The application communication module 7110 may transmit data or information, provided through a user interface, to the data processing module 7120.

The data processing module 7120 may be linked to the local resource module 7150. Herein, the local resource module 7150 may provide a list of repair shops/dealers/technical information to a user on the basis of information or data inputted to the server 7100.

The upgrade module 7130 may interface with the data processing module 7120. Based on information or data received from the SSD 7200, the upgrade module 7130 may perform upgrades of a firmware, a reset code, a diagnosis system, or other information on electronic appliances.

The scheduling center 7140 may provide real-time options to the user based on the information or data inputted to the server 7100.

The repair information module 7160 may interface with the data processing module 7120. The repair information module 7160 may be used to provide repair-related information (e.g., audio, video or document files) to the user. The data processing module 7120 may package information related to the information received from the SSD 7200. The packaged information may be transmitted to the SSD 7200 or may be displayed to the user.

A memory system according to an exemplary embodiment of the inventive concept may be applicable to a PPN (Perfect Page New) device.

Figure 21:
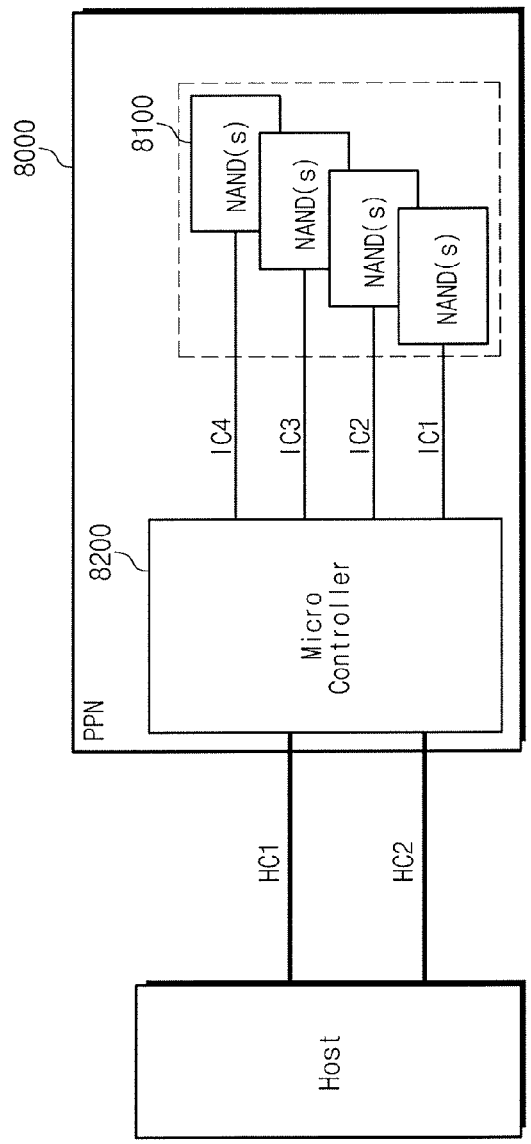
FIG. 21 is a block diagram of a PPN device according to an exemplary embodiment of the inventive concept.

FIG. 21 is a block diagram of a PPN device according to an exemplary embodiment of the inventive concept. Referring to FIG. 21, a PPN device 8000 includes a plurality of NAND flash memories 8100 and a controller 8200 for controlling the plurality of NAND flash memories 8100. The PPN device 8000 may implement one of memory systems 10, 20, and 30 in FIGS. 1, 11, and 12 and a nonvolatile memory device 400 in FIG. 13.

The PPN device 8000 communicate with a host via the PPN protocol having a DDR (double data rate) interface. Data communication between the PPN device 8000 and the host may be made via the first and second host channels HC1 and HC2. Herein, the number of host channels is not limited to 2. The PPN device 8000 may guarantee the reliability of data such that the host does not include an ECC engine. The PPN device 8000 may guarantee 3000 program/erase cycles over three years.

Data communication between the NAND flash memories 8100 and the controller 8200 may be made via the inner channels IC1 to IC4. Herein, the number of inner channels is not limited to 4.

A memory system according to an exemplary embodiment of the inventive concept may be applicable to a tablet product (e.g., Galaxy S, iPad, etc.).

Figure 22:
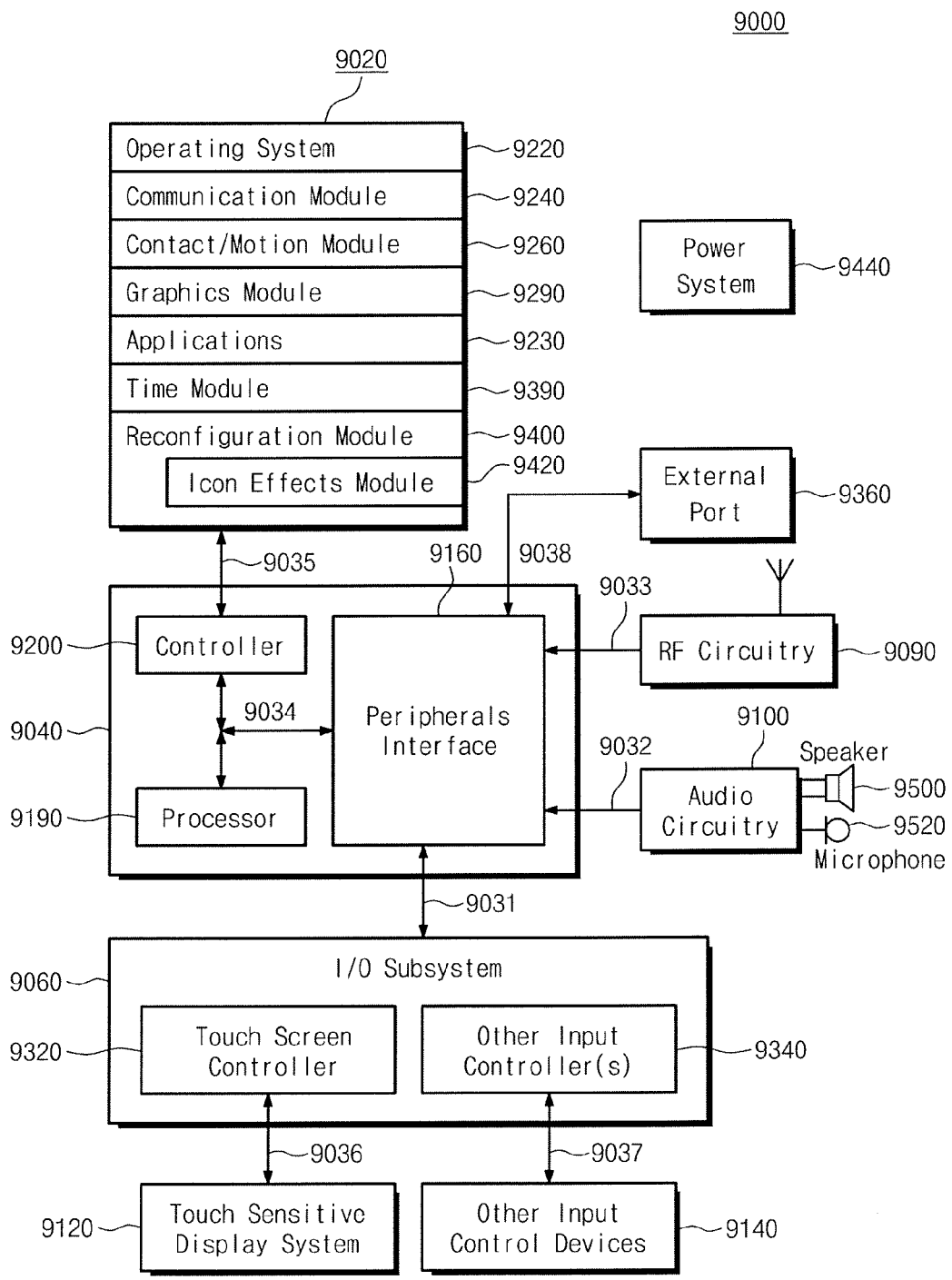
FIG. 22 is a block diagram of a mobile electronic device according to an exemplary embodiment of the inventive concept.

FIG. 22 is a block diagram of a mobile electronic device according to an exemplary embodiment of the inventive concept. Referring to FIG. 22, a mobile electronic device 9000 includes at least one computer-readable medium 9020, a processing system 9040, an input/output sub-system 9060, a radio frequency circuit 9080, and an audio circuit 9100. The elements may be interconnected via at least one communication bus or signal lines 9031, 9032, 9033, 9033, 9034, 9035, 9036, 9037, and 9038.

The mobile electronic device 9000 may be a device including an unlimited handheld computer, a tablet computer, a cellular phone, a media player, a PDA, and a combination of at least two thereof. Herein, the computer-readable medium 9020 may be configured to one of memory systems 10, 20, and 30 in FIGS. 1, 11, and 12 and a nonvolatile memory device 400 in FIG. 13. An exemplary mobile electronic device is described in detail in U.S. Pat. No. 7,509,588, the entirety of which is incorporated by reference herein.

Memory systems or storage devices according to the inventive concept may be mounted in various types of packages. Examples of the packages of the memory system or the storage device according to the inventive concept may include Package on Package (PoP), Ball Grid Arrays (BGAs), Chip Scale Packages (CSPs), Plastic Leaded Chip Carrier (PLCC), Plastic Dual In-line Package (PDIP), Die in Waffle Pack, Die in Wafer Form, Chip On Board (COB), Ceramic Dual In-line Package (CERDIP), Plastic Metric Quad Flat Pack (MQFP), Thin Quad Flat Pack (TQFP), Small Outline Integrated Circuit (SOIC), Shrink Small Outline Package (SSOP), Thin Small Outline Package (TSOP), System In Package (SIP), Multi Chip Package (MCP), Wafer-level Fabricated Package (WFP), and Wafer-level Processed Stack Package (WSP).

The above-disclosed subject matter is to be considered illustrative, and not restrictive, and the appended claims are intended to cover all such modifications, enhancements, and other embodiments, which fall within the true spirit and scope. Thus, to the maximum extent allowed by law, the scope is to be determined by the broadest permissible interpretation of the following claims and their equivalents, and shall not be restricted or limited by the foregoing detailed description.

What is claimed is:

1. A nonvolatile memory device comprising:
a memory cell array including a plurality of blocks having a plurality of strings connected between a bit line and a common source line, each of the plurality of strings including at least one string selection transistor, first memory cells and at least one ground selection transistor connected in series, each of the first memory cells being connected with word lines stacked in a direction perpendicular to a substrate, wherein second memory cells connected with one word line of the word lines constitute one page;
an address decoder configured to select one of the plurality of blocks based on an address;
an input/output circuit configured to connect to the memory cell array through bit lines and the word lines, and to store program data in a page connected to a selected word line of the word lines in the selected block at a program operation; and
a control logic configured to control the address decoder and the input/output circuit at the program operation,
wherein the program data include first data and second data,
wherein the first data includes meta data including a seed for randomizing user data, a first parity for a first ECC (error correction code) operation regarding the meta data, and a second parity for a second ECC operation regarding the user data,
wherein the second data include the user data.

2. The nonvolatile memory device of claim 1, wherein the each string further comprises at least one first dummy cell between the at least one string selection transistor and the first memory cells or at least one second dummy cell between the at least one ground selection transistor and the first memo cells.

3. The nonvolatile memory device of claim 2, wherein the at least one stringy selection transistor includes a first string selection transistor and a second string selection transistor.

4. The nonvolatile memory device of claim 3, further comprising a string selection line commonly coupled to gates of the first and second string selection transistors.

5. The nonvolatile memory device of claim 4, further comprising a first string selection line coupled to a gate of the first string selection transistor and a second string selection line coupled to a gate of the second string selection transistor.

6. The nonvolatile memory device of claim 2, wherein the at least one ground selection transistor includes a first ground selection transistor and a second ground selection transistor.

7. The nonvolatile memory device of claim 1, wherein the seed is located at a front portion of the meta data.

8. The nonvolatile memory device of claim 1, wherein the see is located at a rear portion of the meta data.

9. The nonvolatile memory device of claim 1, wherein the control logic reads the first data and the second data from the second memory cells at a read operation,
wherein the first data are corrected the first ECC operation and the second data are corrected by the second ECC operation.

10. The nonvolatile memory device of claim 9, wherein the first ECC operation and the second ECC operation are performed outside of the nonvolatile memory device.

11. The nonvolatile memory device of claim 9, wherein the first ECC operation and the second ECC operation are performed in the nonvolatile memory device.

12. The nonvolatile memory device of claim 11, further comprising an ECC circuit configured to perform the first ECC operation or the second ECC operation.

13. The nonvolatile memory device of claim 12, further comprising a randomizing circuit configured to de-randomize the user data using the seed from the ECC circuit.

14. The nonvolatile memory device of claim 1, wherein a size of the first data is smaller than that of the second data.

15. A storage device comprising:
a plurality of nonvolatile memory devices; and
a memory controller configured to connect to the plurality of nonvolatile memory devices through a plurality of channels and to control the plurality of nonvolatile memory devices,
wherein each of the plurality of nonvolatile memory devices comprises,
a memory cell array including a plurality of blocks having a plurality of strings connected between a bit line and a common source line, each of the plurality of strings including at least one string selection transistor, first memory cells and at least one ground selection transistor connected in series, each the first memory cells being connected with word lines stacked in a direction perpendicular to a substrate, wherein second memory cells connected with one word line of the word lines constitute one page;
an address decoder configured to select one of the plurality of blocks based on an address;
an input/output circuit configured to connect to the memory cell array through bit lines and the word lines, and to store program data in a page connected to a selected word liter of the word lines in the selected block at a program operation; and
a control logic configured to control the address decoder and the input/output circuit at the program operation, wherein the program data includes first data and second data, wherein the first data includes meta data including a seed for randomizing user data, a first parity for a first ECC (error correction code) operation regarding the meta data, and a second parity for a second ECC operation regarding the user data, wherein the second data includes the user data.

16. The storage device of claim 5, wherein the memory controller includes: an ECC circuit configured to perform the first ECC operation or the second ECC operation; and a randomizing circuit configured to de-randomize the user data using the seed from the ECC circuit.

17. The storage device of claim 16, wherein the memory controller receives the user data from at least one of the nonvolatile memory devices in parallel when the ECC circuit performs the first ECC operation regarding the first data, wherein the first data and the second data are read from the second memory cells at a read operation.

18. The storage device of claim 5, wherein the storage device is one of a solid state drive (SSD), embedded multimedia card (eMMC) and universal flash storage (UFS).

19. A method for operating at least one nonvolatile memory device in a storage device, wherein the at least one nonvolatile memory device includes a plurality of blocks having a plurality of strings connected between a bit line and a common source line, each of the plurality of strings including at least one string selection transistor, first memory cells and at least one ground selection transistor connected in series, each of the first memory cells being connected with word lines stacked in a direction perpendicular to a substrate, wherein second memory cells connected with one word line of the word lines constitute one page, the method:

randomizing user data using a seed;

encoding the user data and meta data including the seed by using an error correction code (ECC), respectively;

generating first data including spare data including the encoded meta data, a first parity for a first ECC operation regarding the meta data, and a second parity for a second ECC operation regarding the user data; and outputting the encoded user data and first data to the at least one nonvolatile memory device.

20. The method of claim 19, further comprising:

receiving the first data from the at least one nonvolatile memory device;

decoding the first data by performing the first ECC operation; and receiving the user data from the at least one nonvolatile memory device during the first ECC operation.

* * * * *